US012765294B2

(12) United States Patent
Degai et al.

(10) Patent No.: US 12,765,294 B2
(45) Date of Patent: Oct. 13, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Motomu Degai, Toyama (JP); Kimihiko Nakatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 554 days.

(21) Appl. No.: 18/335,207

(22) Filed: Jun. 15, 2023

(65) Prior Publication Data

US 2023/0411165 A1 Dec. 21, 2023

(30) Foreign Application Priority Data

Jun. 17, 2022 (JP) ................................. 2022-098420

(51) Int. Cl.

| | |
|---|---|
| ***H10P 50/28*** | (2026.01) |
| ***H10P 14/692*** | (2026.01) |
| ***H10P 14/694*** | (2026.01) |
| ***H10P 72/00*** | (2026.01) |

(52) U.S. Cl.

CPC ...... *H10P 50/283* (2026.01); *H10P 14/69215* (2026.01); *H10P 14/69433* (2026.01); *H10P 72/0421* (2026.01)

(58) Field of Classification Search

None

See application file for complete search history.

(56) References Cited

U.S. PATENT DOCUMENTS

| | | | |
|---|---|---|---|
| 2016/0196984 | A1 | 7/2016 | Lill et al. |
| 2019/0109012 | A1 | 4/2019 | Imai et al. |
| 2021/0159088 | A1 | 5/2021 | Degai et al. |

(Continued)

FOREIGN PATENT DOCUMENTS

| | | | |
|---|---|---|---|
| JP | 2009-065028 | A | 3/2009 |
| JP | 2021-082774 | A | 5/2021 |

(Continued)

OTHER PUBLICATIONS

Korean Office Action issued on Sep. 25, 2024 for Korean Patent Application No. 10-2023-0077329.

(Continued)

*Primary Examiner* — Binh X Tran
(74) *Attorney, Agent, or Firm* — Volpe Koenig

(57) ABSTRACT

There is provided a technique that includes: performing a cycle a predetermined number of times, the cycle including: (a) forming a first layer on a surface of a first film by supplying a processing agent to a substrate including the first film on a surface of the substrate; and (b) etching the first layer and at least a portion of the first film by supplying an etching agent to the substrate, wherein in (b), when etching the first layer, a substance X that reacts with the etching agent but does not contribute alone to the etching is generated, and the first layer and the at least a portion of the first film are etched by using a mixture of the substance X and the etching agent.

23 Claims, 9 Drawing Sheets

(56) References Cited

U.S. PATENT DOCUMENTS

| | | | | |
|---|---|---|---|---|
| 2022/0020598 | A1* | 1/2022 | Nakatani | H10P 50/242 |
| 2022/0102137 | A1 | 3/2022 | Miyata et al. | |
| 2022/0122848 | A1* | 4/2022 | Peter | H10P 50/283 |
| 2022/0199421 | A1 | 6/2022 | Degai et al. | |
| 2022/0285167 | A1* | 9/2022 | Shaw | H01J 37/321 |
| 2023/0098270 | A1* | 3/2023 | Agnew | C23C 16/401<br>438/790 |
| 2024/0093360 | A1* | 3/2024 | Chandra | C23C 16/45527 |

FOREIGN PATENT DOCUMENTS

| | | | |
|---|---|---|---|
| JP | 2022-018973 | A | 1/2022 |
| KR | 10-2016-0084313 | A | 7/2016 |
| KR | 10-2021-0063249 | A | 6/2021 |
| KR | 10-2022-0043872 | A | 4/2022 |

OTHER PUBLICATIONS

Extended European Search Report issued on Nov. 9, 2023 for European Patent Application No. 23179436.3.

* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2022-098420, filed on Jun. 17, 2022, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

In the related art, as a process of manufacturing a semiconductor device, a process of removing a film exposed on a surface of a substrate by etching is performed.

However, depending on a combination of an etching agent used when performing an etching and a film to be etched, it may not be possible to perform a stable etching with good controllability.

SUMMARY

Some embodiments of the present disclosure provide a technique capable of performing a stable etching with good controllability.

According to some embodiments of the present disclosure, there is provided a technique that includes: performing a cycle a predetermined number of times, the cycle including: (a) forming a first layer on a surface of a first film by supplying a processing agent to a substrate including the first film on a surface of the substrate; and (b) etching the first layer and at least a portion of the first film by supplying an etching agent to the substrate, wherein in (b), when etching the first layer, a substance X that reacts with the etching agent but does not contribute alone to the etching is generated, and the first layer and the at least a portion of the first film are etched by using a mixture of the substance X and the etching agent.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
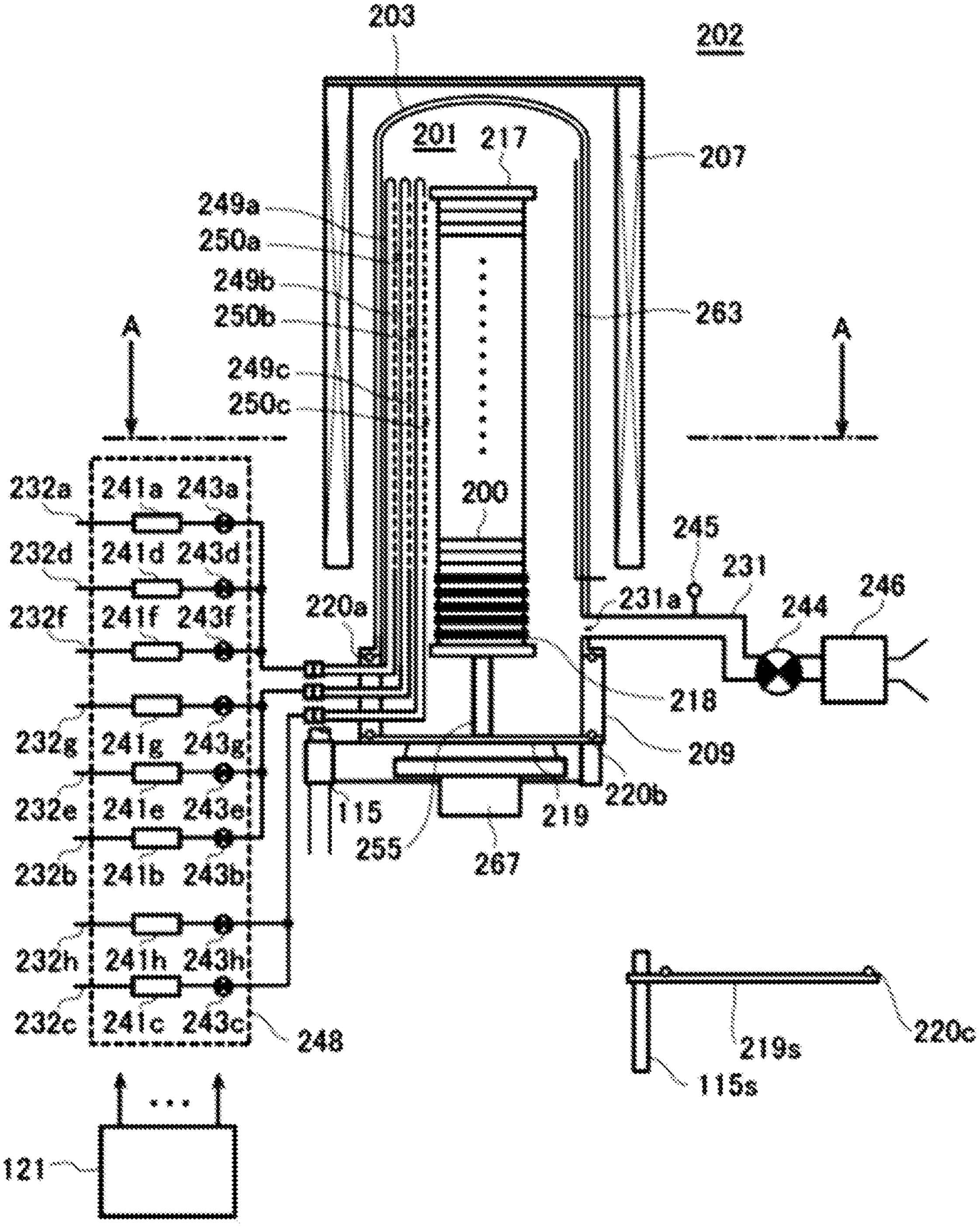
FIG. 1 is a schematic configuration diagram of a vertical process furnace of a substrate processing apparatus suitably used in some embodiments of the present disclosure, in which a portion of the process furnace is illustrated in a vertical cross-sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described above in detail so as not to obscure aspects of the various embodiments.

Embodiments of the Present Disclosure

Hereinafter, embodiments of the present disclosure will be described mainly with reference to FIGS. 1 to 3 and 4A to 4E. The drawings used in the following description are schematic, and dimensional relationships of the respective components, ratios of the respective components, and the like shown in the drawings may not match actual ones. Moreover, dimensional relationships of the respective components, ratios of the respective components, and the like may not match among a plurality of drawings.

(1) Configuration of Substrate Processing Apparatus

As shown in FIG. 1, a process furnace 202 includes a heater 207 as a temperature regulator (heating part). The heater 207 is formed in a cylindrical shape and is vertically installed by being supported by a holding plate. The heater 207 also functions as an activator (exciter) configured to activate (excite) a gas with heat.

Inside the heater 207, a reaction tube 203 is arranged concentrically with the heater 207. The reaction tube 203 is made of heat-resistant material such as, for example, quartz ($SiO_2$) or silicon carbide (SiC) and is formed in a cylindrical shape with an upper end thereof closed and a lower end thereof opened. Below the reaction tube 203, a manifold 209 is arranged concentrically with the reaction tube 203. The manifold 209 is made of metallic material such as stainless steel (SUS) or the like and is formed in a cylindrical shape with upper and lower ends thereof opened. The upper end of the manifold 209 is engaged with the lower end of the reaction tube 203 and is configured to support the reaction tube 203. An O-ring 220*a* as a seal is provided between the manifold 209 and the reaction tube 203. The reaction tube 203 is installed vertically in the same manner as the heater 207. A process container (reaction container) mainly includes the reaction tube 203 and the manifold 209. A process chamber 201 is formed in a hollow area of the process container. The process chamber 201 is configured to be capable of accommodating wafers 200 as substrates. The wafers 200 are processed in the process chamber 201.

Nozzles 249*a* to 249*c* as first to third suppliers are installed in the process chamber 201 to penetrate a side wall of the manifold 209. The nozzles 249*a* to 249*c* are also referred to as first to third nozzles, respectively. The nozzles 249*a* to 249*c* are made of, for example, heat-resistant material such as quartz or SiC. Gas supply pipes 232*a* to 232*c* are connected to the nozzles 249*a* to 249*c*, respectively. The nozzles 249*a* to 249*c* are different nozzles, and the nozzles 249*a* and 249*c* are installed adjacent to the nozzle 249*b*.

At the gas supply pipes 232*a* to 232*c*, mass flow controllers (MFCs) 241*a* to 241*c*, which are flow rate controllers (flow rate control parts), and valves 243*a* to 243*c*, which are on-off valves, are respectively installed sequentially from the upstream side of a gas flow. Gas supply pipes 232*d* and 232*f* are respectively connected to the gas supply pipe 232*a* on the downstream side of the valve 243*a*. Gas supply pipes 232*e* and 232*g* are respectively connected to the gas supply pipe 232*b* on the downstream side of the valve 243*b*. A gas supply pipe 232*h* is connected to the gas supply pipe 232*c* on the downstream side of the valve 243*c*. At the gas supply pipes 232*d* to 232*h*, MFCs 241*d* to 241*h* and valves 243*d* to 243*h* are respectively installed sequentially from the upstream side of a gas flow. The gas supply pipes 232*a* to 232*h* are made of, for example, metallic material such as stainless steel or the like.

Figure 2:
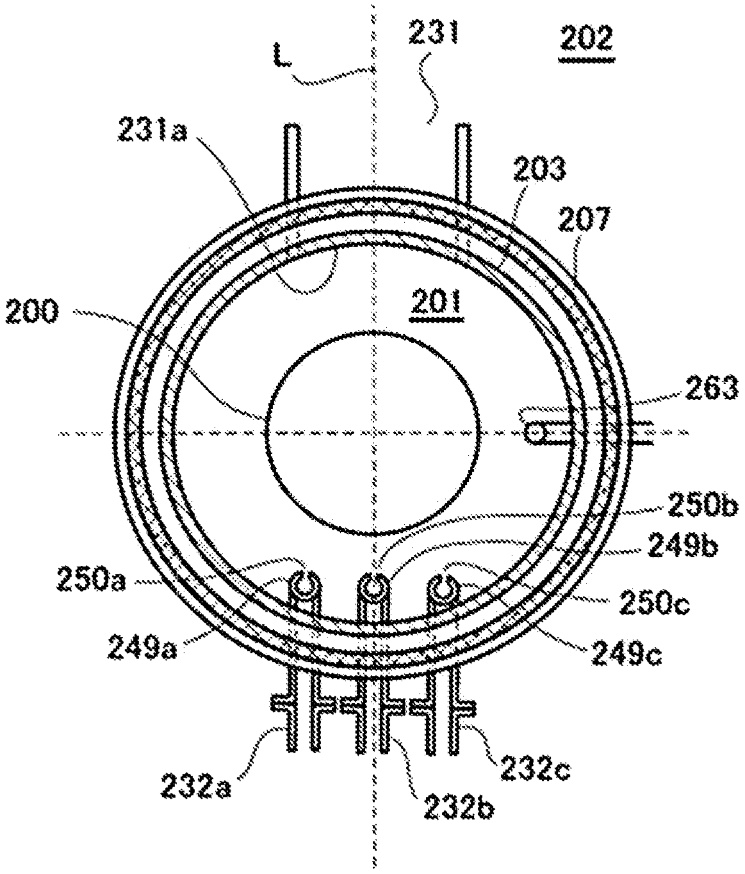
FIG. 2 is a schematic configuration diagram of a vertical process furnace of a substrate processing apparatus suitably used in some embodiments of the present disclosure, in which a portion of the process furnace is illustrated in a cross-sectional view taken along line A-A in FIG. 1.

As shown in FIG. 2, the nozzles 249*a* to 249*c* are arranged in a space of an annular shape in a plan view between the inner wall of the reaction tube 203 and the wafers 200 and are installed to extend upward in an arrangement direction of the wafers 200 from a lower side to an upper side of the inner wall of the reaction tube 203. In other words, the nozzles 249*a* to 249*c* are respectively installed in a region horizontally surrounding a wafer arrangement region, in which the wafers 200 are arranged, on a lateral side of the wafer arrangement region so as to extend along the wafer arrangement region. In a plan view, the nozzle 249*b* is arranged to face the below-described exhaust port 231*a* on a straight line across centers of the wafers 200 loaded into the process chamber 201. The nozzles 249*a* and 249*c* are arranged such that a straight line L passing through the nozzle 249*b* and a center of the exhaust port 231*a* are interposed between both sides along the inner wall of the reaction tube 203 (outer peripheral sides of the wafers 200). The straight line L is also a straight line passing through the nozzle 249*b* and the center of the wafers 200. That is, it may be said that the nozzle 249*c* is installed on an opposite side of the nozzle 249*a* with the straight line L interposed therebetween. The nozzles 249*a* and 249*c* are arranged line-symmetrically with the straight line L as an axis of symmetry. Gas supply holes 250*a* to 250*c* configured to supply gases are formed on side surfaces of the nozzles 249*a* to 249*c*, respectively. The gas supply holes 250*a* to 250*c* are respectively opened to face the exhaust port 231*a* in a plan view and may supply gases toward the wafers 200. The gas supply holes 250*a* to 250*c* are formed from a lower side to an upper side of the reaction tube 203.

A modifying agent is supplied from the gas supply pipe 232*a* into the process chamber 201 via the MFC 241*a*, the valve 243*a*, and the nozzle 249*a*.

A precursor is supplied from the gas supply pipe 232*b* into the process chamber 201 via the MFC 241*b*, the valve 243*b*, and the nozzle 249*b*. The precursor is used as a processing agent.

A reactant is supplied from the gas supply pipe 232*c* into the process chamber 201 via the MFC 241*c*, the valve 243*c*, and the nozzle 249*c*. The reactant is used as a processing agent. As the reactant, a reactant containing hydrogen (H) and oxygen (O) may be used.

A catalyst is supplied from the gas supply pipe 232*d* into the process chamber 201 via the MFC 241*d*, the valve 243*d*, the gas supply pipe 232*a*, and the nozzle 249*a*. The catalyst is used as a processing agent.

An etching agent is supplied from the gas supply pipe 232*e* into the process chamber 201 via the MFC 241*e*, the valve 243*e*, the gas supply pipe 232*b*, and the nozzle 249*b*.

An inert gas is supplied from the gas supply pipes 232*f* to 232*h* into the process chamber 201 via the MFCs 241*f* to 241*h*, the valves 243*f* to 243*h*, the gas supply pipes 232*a* to 232*c*, and the nozzles 249*a* to 249*c*, respectively. The inert gases act as a purge gas, a carrier gas, a dilution gas, and the like.

A modifying agent supply system mainly includes the gas supply pipe 232*a*, the MFC 241*a*, and the valve 243*a*. A precursor supply system mainly includes the gas supply pipe 232*b*, the MFC 241*b*, and the valve 243*b*. A reactant supply system mainly includes the gas supply pipe 232*c*, the MFC 241*c*, and the valve 243*c*. A catalyst supply system mainly includes the gas supply pipe 232*d*, the MFC 241*d*, and the valve 243*d*. An etching agent supply system mainly includes the gas supply pipe 232*e*, the MFC 241*e*, and the valve 243*e*. An inert gas supply system mainly includes the gas supply pipes 232*f* to 232*h*, the MFCs 241*f* to 241*h*, and the valves 243*f* to 243*h*. Each or the entirety of the precursor supply system, the reactant supply system, and the catalyst supply system are also referred to as a processing agent supply system.

Any one or the entirety of the various supply systems described above may be configured as an integrated supply system 248 in which the valves 243*a* to 243*h*, the MFCs 241*a* to 241*h*, and the like are integrated. The integrated supply system 248 is connected to each of the gas supply pipes 232*a* to 232*h*, and is configured such that an operation of supplying various substances (various gases) into the gas supply pipes 232*a* to 232*h*, i.e., opening/closing operations of the valves 243*a* to 243*h*, flow rate regulation operations by the MFCs 241*a* to 241*h*, and the like are controlled by a controller 121 described below. The integrated supply system 248 is configured as an integral or divided integrated unit, and is configured such that the integrated supply system 248 may be attached to or detached from the gas supply pipes 232*a* to 232*h*, and the like on an integrated unit basis, and maintenance, replacement, expansion, and the like of the integrated supply system 248 may be performed on an integrated unit basis.

An exhaust port 231*a* configured to exhaust the atmosphere in the process chamber 201 is provided at the lower side of the side wall of the reaction tube 203. As shown in FIG. 2, the exhaust port 231*a* is provided at a position facing the nozzles 249*a* to 249*c* (gas supply holes 250*a* to 250*c*) with the wafers 200 interposed therebetween in a plan view. The exhaust port 231*a* may be provided to extend from the lower side to the upper side of the side wall of the reaction tube 203, i.e., along the wafer arrangement region. An exhaust pipe 231 is connected to the exhaust port 231*a*. A vacuum pump 246 as a vacuum exhauster is connected to the exhaust pipe 231 via a pressure sensor 245 as a pressure detector (pressure detection part) configured to detect an internal pressure of the process chamber 201 and a APC (Auto Pressure Controller) valve 244 as a pressure regulator (pressure regulation part). The APC valve 244 is configured to be capable of performing or stopping vacuum exhaust of the interior of the process chamber 201 by being opened and closed in a state in which the vacuum pump 246 is operated. Further, the APC valve 244 is configured to be capable of regulating the internal pressure of the process chamber 201 by adjusting a valve opening state based on pressure information detected by the pressure sensor 245 in a state in which the vacuum pump 246 is operated. An exhaust system mainly includes the exhaust pipe 231, the APC valve 244, and the pressure sensor 245. The vacuum pump 246 may be included in the exhaust system.

A seal cap 219 as a furnace opening lid capable of airtightly closing a lower end opening of the manifold 209 is installed below the manifold 209. The seal cap 219 is made of metallic material such as, for example, stainless steel or the like, and is formed in a disc shape. On the upper surface of the seal cap 219, there is installed an O-ring 220*b* as a seal that comes into contact with the lower end of the manifold 209. Below the seal cap 219, there is installed a rotator 267 configured to rotate a boat 217 described below. A rotating shaft 255 of the rotator 267 is connected to the boat 217 through the seal cap 219. The rotator 267 is configured to rotate the wafers 200 by rotating the boat 217. The seal cap 219 is configured to be raised or lowered in the vertical direction by a boat elevator 115 as an elevator installed outside the reaction tube 203. The boat elevator 115 is configured as a transfer apparatus (transfer mechanism) configured to load or unload (transfer) the wafers 200 into or out of the process chamber 201 by raising or lowering the seal cap 219.

Below the manifold 209, a shutter 219*s* is installed as a furnace opening lid capable of airtightly closing the lower end opening of the manifold 209 in a state in which the seal cap 219 is lowered and the boat 217 is unloaded from the process chamber 201. The shutter 219*s* is made of metallic material such as stainless steel or the like and is formed in a disc shape. An O-ring 220*c* as a seal that comes into contact with the lower end of the manifold 209 is installed on the upper surface of the shutter 219*s*. Opening/closing operations (an elevating operation, a rotating operation, and the like) of the shutter 219*s* are controlled by a shutter opening/closing mechanism 115*s*.

A boat 217 serving as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another. That is, as the boat 217 is configured to arrange the wafers 200 to be spaced apart from each other. The boat 217 is made of, for example, heat-resistant material such as quartz or SiC. Heat insulating plates 218 made of, for example, heat-resistant material such as quartz or SiC, are supported in multiple stages at the bottom of the boat 217.

Inside the reaction tube 203, there is installed a temperature sensor 263 as a temperature detector. By regulating a state of supplying an electric power to the heater 207 based on the temperature information detected by the temperature sensor 263, the internal temperature of the process chamber 201 falls within a desired temperature distribution. The temperature sensor 263 is installed along the inner wall of the reaction tube 203.

Figure 3:
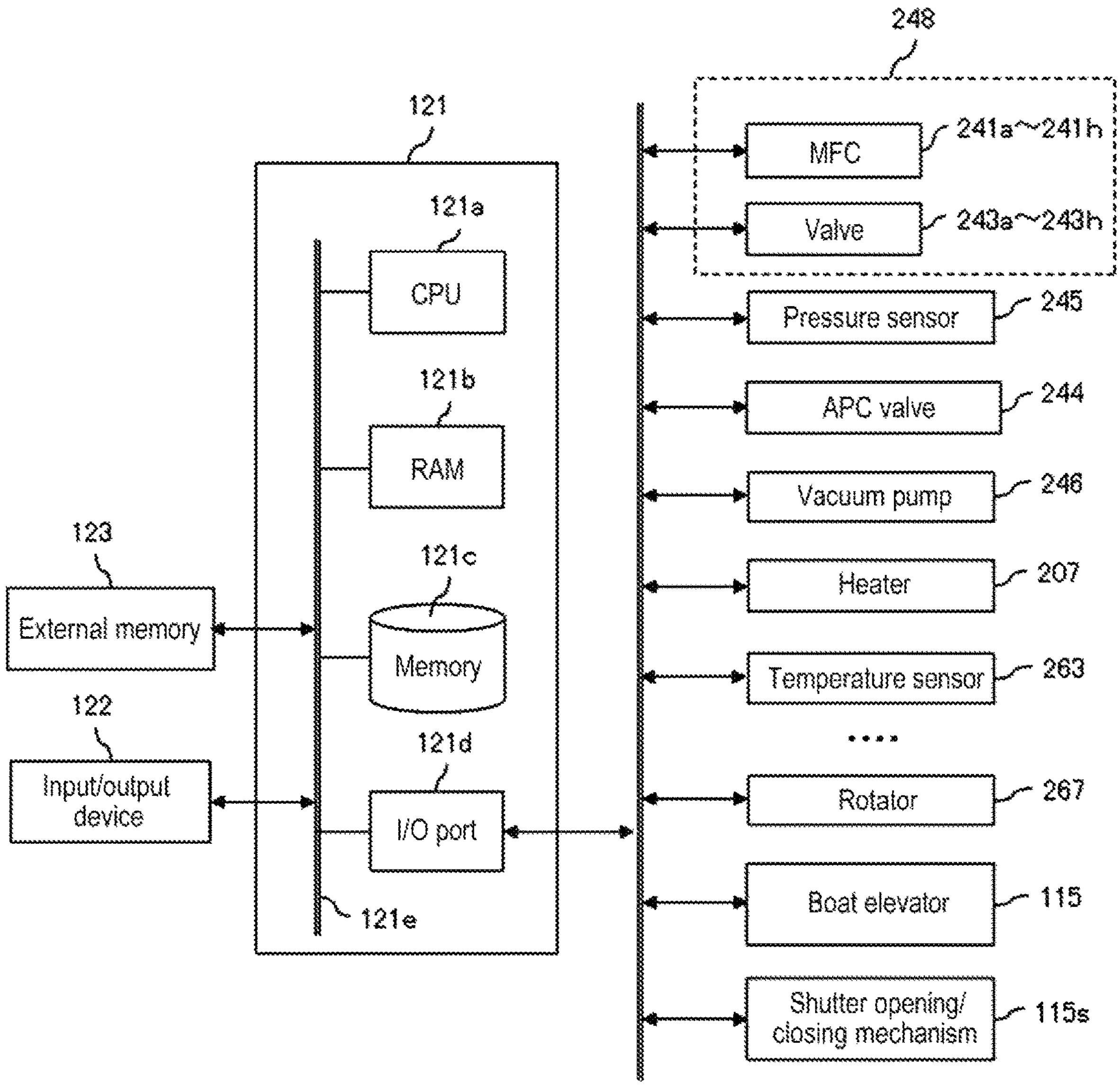
FIG. 3 is a schematic configuration diagram of a controller of a substrate processing apparatus suitably used in some embodiments of the present disclosure, in which a control system of the controller is illustrated in a block diagram.

As shown in FIG. 3, the controller 121 as a control part (control means or unit) is configured as a computer including a CPU (Central Processing Unit) 121*a*, a RAM (Random Access Memory) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 including, for example, a touch panel or the like is connected to the controller 121. In addition, an external memory 123 may be connected to the controller 121.

The memory 121*c* includes, for example, a flash memory, a HDD (Hard Disk Drive), a SSD (Solid State Drive), or the like. In the memory 121*c*, there are readably recorded and stored a control program that controls the operation of the substrate processing apparatus, a process recipe in which procedures and conditions of substrate processing described below are written, and the like. The process recipe is a combination that causes, by the controller 121, the substrate processing apparatus to execute the respective procedures in a below-described substrate processing process so as to obtain a predetermined result. The process recipe functions as a program. Hereinafter, the process recipe, the control program, and the like are collectively and simply referred to as a program. Furthermore, the process recipe is simply referred to as a recipe. When the term "program" is used herein, it may mean a case of including the recipe, a case of including the control program, or a case of including both the recipe and the control program. The RAM 121*b* is configured as a memory area (work area) in which programs, data, and the like read by the CPU 121*a* are temporarily held.

The I/O port 121*d* is connected to the MFCs 241*a* to 241*h*, the valves 243*a* to 243*h*, the pressure sensor 245, the APC valve 244, the vacuum pump 246, the temperature sensor 263, the heater 207, the rotator 267, the boat elevator 115, the shutter opening/closing mechanism 115*s*, and the like.

The CPU 121*a* is configured to be capable of reading and executing the control program from the memory 121*c* and reading the recipe from the memory 121*c* in response to an input of an operation command from the input/output device 122 or the like. The CPU 121*a* is configured to be capable of, according to the contents of the recipe thus read, controlling the flow rate regulation operations for various substances (various gases) by the MFCs 241*a* to 241*h*, the opening/closing operations of the valves 243*a* to 243*h*, the opening/closing operation of the APC valve 244, the pressure regulation operation by the APC valve 244 based on the pressure sensor 245, the start and stop of the vacuum pump 246, the temperature regulation operation of the heater 207 based on the temperature sensor 263, the rotation and the rotation speed adjustment operation of the boat 217 by the rotator 267, the raising and lowering operation of the boat 217 by the boat elevator 115, the opening/closing operation of the shutter 219*s* by the shutter opening/closing mechanism 115*s*, and the like.

The controller 121 may be configured by installing, in the computer, the above-described program recorded and stored in an external memory 123. The external memory 123 includes, for example, a magnetic disk such as a HDD or the like, an optical disc such as a CD or the like, a magneto-optical disc such as a MO or the like, a semiconductor memory such as a USB memory, a SSD, or the like, and so forth. The memory 121*c* and the external memory 123 are configured as a computer readable recording medium. Hereinafter, the memory 121*c* and the external memory 123 are collectively and simply referred to as a recording medium. As used herein, the term "recording medium" may include the memory 121*c*, the external memory 123, or both. The program may be provided to the computer by using a communication means or unit such as the Internet or a dedicated line without using the external memory 123.

(2) Substrate Processing Process

An example of a method of processing a substrate, that is, a processing sequence of etching a first film on a surface of a wafer 200 as a substrate, as a process (method) of manufacturing a semiconductor device, by using the above-described substrate processing apparatus will be described mainly with reference to FIGS. 4A to 4E. In the following description, operations of the respective components constituting the substrate processing apparatus are controlled by the controller 121.

A substrate processing sequence according to the embodiments of the present disclosure includes:

performing a cycle a predetermined number of times (n times, where n is an integer equal to or greater than 1), the cycle including:

(a) step A of forming a first layer on a surface of a first film by supplying a processing agent to a wafer 200 including the first film on a surface thereof; and (b) step B of etching the first layer and at least a portion of the first film by supplying an etching agent to the wafer 200, wherein in step B, when etching the first layer, a substance X that reacts with the etching agent but does not contribute alone to the etching (hereinafter, also simply referred to as substance X) is generated, and the first layer and at least a portion of the first film are etched by using a mixture of the substance X and the etching agent.

In the following example, a case will be described in which, in step A, a precursor and a reactant containing H and O are supplied to the wafer 200 as processing agents. Specifically, in the following example, a case will be described in which, in step A, step A1 of supplying the precursor to the wafer 200 and step A2 of supplying the reactant containing H and O to the wafer 200 are performed alternately, and a catalyst is further supplied to the wafer 200 in at least one selected from the group of step A1 and step A2.

That is, an example of the substrate processing sequence described below includes:

performing a cycle a predetermined number of times (n times, where n is an integer equal to or greater than 1), the cycle including:

(a) step A of performing, a predetermined number of times (m times, where m is an integer equal to or greater than 1), a cycle including step A1 of supplying a precursor to a wafer 200 including a first film on a surface thereof and step A2 of supplying a reactant containing H and O to the wafer 200, wherein a catalyst is further supplied to the wafer 200 in at least one selected from the group of step A1 and step A2; and (b) step B of etching a first layer and at least a portion of the first film by supplying an etching agent to the wafer 200, wherein in step B, when etching the first layer, a substance X that reacts with the etching agent but does not contribute alone to the etching is generated, and the first layer and at least a portion of the first film are etched by using a mixture of the substance X and the etching agent. Further, in step A, the supply of the catalyst may be omitted depending on a processing condition.

Further, in the following example, as described above, a case will be described in which the processing agents supplied to the wafer 200 in step A includes a precursor, a reactant containing H and O, and a catalyst. The precursor, the reactant containing H and O, and the catalyst differ from one another in molecular structure.

In the present disclosure, the above-described processing sequences may be indicated as follows for the sake of convenience. The same notation may be used in the following description of modifications and the like.

$$[(\text{precursor}+\text{catalyst}\rightarrow\text{reactant}+\text{catalyst})\times m\rightarrow\text{etching agent}]\times n$$

$$[(\text{precursor}+\text{catalyst}\rightarrow\text{reactant})\times m\rightarrow\text{etching agent}]\times n$$

$$[(\text{precursor}\rightarrow\text{reactant}+\text{catalyst})\times m\rightarrow\text{etching agent}]\times n$$

The term "wafer" used herein may refer to "a wafer itself" or "a stacked body of a wafer and a predetermined layer or film formed on a surface of the wafer." The phrase "a surface of a wafer" used herein may refer to "a surface of a wafer itself" or "a surface of a predetermined layer or the like formed on a wafer." The expression "a predetermined layer is formed on a wafer" used herein may mean that "a predetermined layer is directly formed on a surface of a wafer itself" or that "a predetermined layer is formed on a layer or the like formed on a wafer." The term "substrate" used herein may be synonymous with the term "wafer."

As used herein, the term "agent" includes at least one selected from the group of a gaseous substance and a liquid substance. The liquid substance includes a mist substance. That is, each of the processing agents (precursor, reactant, and catalyst), the etching agent, the oxidizing agent, the modifying agent, and the cleaning agent may include a gaseous substance, a liquid substance such as a mist substance or the like, or both of them.

As used herein, the term "layer" includes at least one selected from the group of a continuous layer and a discontinuous layer. For example, the first layer may include a continuous layer, a discontinuous layer, or both of them, as long as it is capable of generating an etching promotion action. Further, for example, the inhibitor layer, which is the second layer, may include a continuous layer, a discontinuous layer, or both of them, as long as it is capable of generating a reaction inhibition action.

(Wafer Charging and Boat Loading)

After a plurality of wafers 200 is charged to the boat 217 (wafer charging), the shutter 219*s* is moved by the shutter opening/closing mechanism 115*s* to open the lower end opening of the manifold 209 (shutter opening). Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220*b*. Thus, the wafer 200 is prepared in the process chamber 201.

Figure 4A:
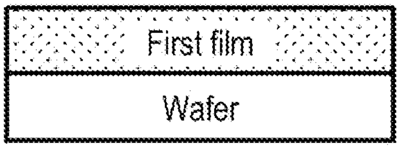
FIG. 4A is a schematic cross-sectional view showing a surface of a wafer including a first film on its surface.

As shown in FIG. 4A, the wafer 200 loaded in the boat 217 includes a first film, which is an etching target film (film to be etched), on the surface thereof. The first film as an etching target film includes a film that may not be directly etched by the etching agent alone due to a low reactivity with the etching agent, or a film that is difficult to directly etch with the etching agent alone. As the first film, for example, an oxygen (O)-containing film such as a silicon oxide film (SiO film) or the like may be used, or an oxygen (O)-free film such as a silicon nitride film (SiN film) or the like may be used. Further, as the first film, for example, a film (a thermal oxide film, a thermal nitride film, a CVD oxide film, a CVD nitride film, or the like) formed by a thermal oxidation method, a thermal nitridation method, a chemical vapor deposition method (CVD method), or the like may be used. The processing temperature when forming the first film is, for example, 350 to 1200 degrees C., specifically 450 to 1100 degrees C.

(Pressure Regulation and Temperature Regulation)

After the boat loading is completed, the inside of the process chamber 201, i.e., a space where the wafers 200 are placed, is vacuum-exhausted (decompression-exhausted) by the vacuum pump 246 so that the pressure inside the process chamber 201 to reach a desired pressure (state of vacuum). In this operation, the internal pressure of the process chamber 201 is measured by the pressure sensor 245, and the APC valve 244 is feedback controlled based on the measured pressure information. Further, the wafer 200 in the process chamber 201 are heated by the heater 207 to reach a desired processing temperature. In this operation, a state of supplying an electric power to the heater 207 is feedback-controlled based on the temperature information detected by the temperature sensor 263 such that a temperature distribution inside the process chamber 201 becomes a desired temperature distribution. Further, the rotation of the wafer 200 by the rotator 267 is started. The exhaust of the inside of the process chamber 201 and the heating and rotation of the wafer 200 may be continuously performed at least until the processing on the wafer 200 is completed.

(Step A)

Thereafter, a first layer is formed on the surface of the first film by supplying a processing agent to the wafer 200. Specifically, the following steps A1 and A2 are sequentially executed. In the following example, a catalyst is supplied in both steps A1 and A2. Further, in the following example, the processing temperature when forming the first layer is lower than the processing temperature when forming the first film. Specifically, in steps A1 and A2, the output of the heater 207 is regulated to keep the processing temperature lower than the processing temperature when forming the first film.

[Step A1]

In step A1, a precursor (precursor gas) and a catalyst (catalyst gas) are supplied as processing agents to the wafer 200, i.e., the wafer 200 including the first film on the surface thereof.

Specifically, the valves 243*b* and 243*d* are opened to allow the precursor and the catalyst to flow into the gas supply pipes 232*b* and 232*d*, respectively. Flow rates of the precursor and the catalyst are regulated by the MFCs 241*b* and 241*d*, respectively. The precursor and the catalyst are supplied into the process chamber 201 via the nozzles 249*b* and 249*a*, mixed in the process chamber 201, and exhausted via the exhaust port 231*a*. At this time, the precursor and the catalyst are supplied to the wafer 200 from a lateral side of the wafer 200 (precursor+catalyst supply). At this time, the valves 243*f* to 243*h* may be opened to supply an inert gas into the process chamber 201 via the nozzles 249*a* to 249*c*, respectively.

By supplying the precursor and the catalyst to the wafer 200 under the processing condition described below, at least a portion of molecular structures of molecules constituting the precursor may be chemically adsorbed on the surface of the first film. Thus, a first precursor layer is formed on the surface of the first film. The first precursor layer contains at least a portion of the molecular structures of the molecules constituting the precursor, which are residues of the precursor. That is, the first precursor layer contains at least a portion of atoms constituting the precursor. In this step, by supplying the catalyst together with the precursor, the formation of the first precursor layer may be performed under low temperature condition described below. By forming the first precursor layer under the low temperature condition described below, the precursor may be prevented from being thermally decomposed (gas-phase-decomposed), that is, autolyzed in the process chamber 201. As a result, multiple deposition of at least a portion of the molecular structures of the molecules constituting the precursor on the surface of the first film may be suppressed, and at least a portion of the molecular structures of the molecules constituting the precursor may be adsorbed.

A processing condition when supplying the precursor and the catalyst in step A1 is exemplified as follows:

Processing temperature: room temperature (25 degrees C.) to 200 degrees C., specifically room temperature to 150 degrees C.

Processing pressure: 133 to 1333 Pa

Precursor supply flow rate: 0.001 to 2 slm

Catalyst supply flow rate: 0.001 to 2 slm

Inert gas supply flow rate (for each gas supply pipe): 0 to 20 slm

Supply time for each substance: 1 to 120 seconds, specifically 1 to 60 seconds.

In the present disclosure, the expression of a numerical range such as "25 to 200 degrees C." means that a lower limit and an upper limit are included in that range. Therefore, for example, "25 to 200 degrees C." means "25 degrees C. or more and 200 degrees C. or less." The same applies to other numerical ranges. Further, a processing temperature in the present disclosure means a temperature of the wafer 200 or an internal temperature of the process chamber 201, and a processing pressure means a pressure inside the process chamber 201. Moreover, a processing time means a time during which the processing is continued. In addition, when 0 slm is included in the supply flow rate, 0 slm means a case where the substance (gas) is not supplied. The same applies to the following description.

After forming the first precursor layer on the surface of the first film of the wafer 200, the valves 243*b* and 243*d* are closed to stop the supply of the precursor and the catalyst into the process chamber 201. Then, the inside of the process chamber 201 is vacuum-exhausted to remove gaseous substances and the like remaining in the process chamber 201 from the process chamber 201. In this operation, the valves 243*f* to 243*h* are opened to supply the inert gas into the process chamber 201 via the nozzles 249*a* to 249*c*. The inert gas supplied from the nozzles 249*a* to 249*c* acts as a purge gas, thereby purging the inside of the process chamber 201 (purging).

A processing condition when performing the purging in step A1 is exemplified as follows:

Processing pressure: 1 to 30 Pa

Processing time: 1 to 120 seconds, specifically 1 to 60 seconds

Inert gas supply flow rate (for each gas supply pipe): 0.5 to 20 slm

The processing temperature when purging in this step may be the same as the processing temperature when supplying the precursor and the catalyst.

For example, a silicon (Si)- and halogen-containing gas (Si- and halogen-containing substance) may be used as the precursor. Halogen includes chlorine (Cl), fluorine (F), bromine (Br), iodine (I), and the like. The Si- and halogen-containing gas may contain halogen in the form of a chemical bond between Si and halogen. As the Si- and halogen-containing gas, for example, a silane-based gas containing Si-Cl bonds, i.e., a chlorosilane-based gas may be used. The Si- and halogen-containing gas may further contain C, and in that case, it may contain C in the form of Si—C bond. As the Si- and halogen-containing gas, for example, a silane-based gas containing Si, Cl, and an alkylene group and containing a Si—C bond, i.e., an alkylenechlorosilane-based gas may be used. The alkylene group includes a methylene group, an ethylene group, a propylene group, a butylene group, and the like. Further, as the Si- and halogen-containing gas, for example, a silane-based gas containing Si, Cl, and an alkyl group and containing a Si—C bond, i.e., an alkylchlorosilane-based gas may be used. The alkyl group includes a methyl group, an ethyl group, a propyl group, a butyl group, and the like. The Si- and halogen-containing gas may further contain O, and in this case, O may be contained in the form of a Si—O bond, for example, in the form of a siloxane bond (Si—O—Si bond). As the Si- and halogen-containing gas, for example, a silane-based gas containing Si, Cl, and a siloxane bond, that is, a chlorosiloxane-based gas may be used. These gases may contain Cl in the form of a Si—Cl bond. In addition to these, a Si- and amino group-containing gas (Si- and amino group-containing substance) such as an aminosilane-based gas or the like may also be used as the precursor.

Examples of the precursor may include bis(trichlorosilyl) methane ($(SiCl_3)_2CH_2$, abbreviation: BTCSM), 1,2-bis (trichlorosilyl)ethane ($(SiCl_3)_2C_2H_4$, abbreviation: BTCSE), 1,1,2,2-tetrachloro-1,2-dimethyldisilane ($(CH_3)_2Si_2Cl_4$, abbreviation: TCDMDS), 1,2-dichloro-1,1,2,2-tetramethyldisilane ($(CH_3)_4Si_2Cl_2$, abbreviation: DCTMDS), 1,1,3,3-tetrachloro-1,3-disilacyclobutane ($C_2H_4Cl_4Si_2$, abbreviation: TCDSCB), and the like. Further, examples of the precursor may include tetrachlorosilane ($SiCl_4$, abbreviation: 4CS), hexachlorodisilane ($Si_2Cl_6$, abbreviation: HCDS), octachlorotrisilane ($Si_3Cl_8$, abbreviation: OCTS), and the like. In addition, examples of the precursor may include hexachlorodisiloxane ($Cl_3Si$—O—$SiCl_3$, abbreviation: HCDSO), octachlorotrisiloxane ($Cl_3Si$—O—$SiCl_2$—O—$SiCl_3$, abbreviation: OCTSO), and the like. One or more selected from the group of these substances may be used as the precursor.

Examples of the precursor may include tetrakis(dimethylamino)silane ($Si[N(CH_3)_2]_4$, abbreviation: 4DMAS), tris (dimethylamino)silane ($Si[N(CH_3)_2]_3H$, abbreviation: 3DMAS), bis(diethylamino)silane ($Si[N(C_2H_5)_2]_2H_2$, abbreviation: BDEAS), bis(tert-butylamino)silane ($SiH_2[NH(C_4H_9)]_2$, abbreviation: BTBAS), (diisopropylamino) silane ($SiH_3[N(C_3H_7)_2]$, abbreviation: DIPAS), and the like. One or more selected from the group of these substances may be used as the precursor.

As the catalyst, for example, an amine-based gas (amine-based substance) containing carbon (C), nitrogen (N), and hydrogen (H) may be used. As the amine-based gas, a cyclic amine-based gas (cyclic amine-based substance) or a chain-like amine-based gas (chain-like amine-based substance) may be used. Examples of the catalyst may include cyclic amine such as pyridine (CSHSN), aminopyridine ($C_5H_6N_2$), picoline ($C_6H_7N$), lutidine ($C_7H_9N$), pyrimidine ($C_4H_4N_2$), quinoline ($C_9H_7N$), piperazine ($C_4HioN_2$), piperidine ($C_5H_{11}N$), aniline ($C_6H_7N$), or the like. Further, examples of the catalyst may include chain-like amine such as triethylamine ($(C_2H_5)_3N$), diethylamine ($(C_2H_5)_2NH$), monoethylamine ($(C_2H_5)NH_2$), trimethylamine ($(CH_3)_3N$), dimethylamine ($(CH_3)_2NH$), monomethylamine ($(CH_3)NH_2$), or the like. One or more selected from the group of these substances may be used as the catalyst. This point also holds true in step A2, which will be described below.

As the inert gas, a nitrogen ($N_2$) gas and a rare gas such as an argon (Ar) gas, a helium (He) gas, a neon (Ne) gas or a xenon (Xe) gas may be used. One or more selected from the group of these gases may be used as the inert gas. This point holds true in each step described below.

[Step A2]

After step A1 is completed, a reactant (reaction gas) containing H and O and a catalyst (catalyst gas) are supplied as processing agents to the wafer 200, i.e., the wafer 200 subjected to the formation of the first precursor layer on the surface of the first film. Hereinafter, the reactant containing H and O is also simply referred to as reactant.

Specifically, the valves 243*c* and 243*d* are opened to allow the reactant and the catalyst to flow into the gas supply pipes 232*c* and 232*d*, respectively. The flow rates of the reactant and the catalyst are regulated by the MFCs 241*c* and 241*d*, respectively. The reactant and the catalyst are supplied into the process chamber 201 via the nozzles 249*c* and 249*a*, mixed in the process chamber 201, and exhausted via the exhaust port 231*a*. At this time, the reactant and the catalyst are supplied to the wafer 200 from the lateral side of the wafer 200 (reactant+catalyst supply). At this time, the valves 243*f* to 243*h* may be opened to supply the inert gas into the process chamber 201 via the nozzles 249*a* to 249*c* respectively.

At least a portion of the first precursor layer formed on the surface of the first film of the wafer 200 in step A1 may be oxidized by supplying the reactant and the catalyst to the wafer 200 under the processing condition described below. As a result, a second precursor layer obtained by the oxidization of the first precursor layer is formed on the surface of the first film. In this step, by supplying the catalyst together with the reactant, the oxidizing reaction may be performed under the low temperature condition described below.

A processing condition when supplying the reactant and the catalyst in step A2 is exemplified as follows.

Processing temperature: room temperature (25 degrees C.) to 200 degrees C., specifically room temperature to 150 degrees C.

Processing pressure: 133 to 1333 Pa

Reactant supply flow rate: 0.001 to 2 slm

Catalyst supply flow rate: 0.001 to 2 slm

Inert gas supply flow rate (for each gas supply pipe): 0 to 20 slm

Supply time for each substance: 1 to 120 seconds, specifically 1 to 60 seconds

After the first precursor layer formed on the surface of the first film is oxidized and changed (converted) into the second precursor layer, the valves 243*c* and 243*d* are closed to stop the supply of the reactant and the catalyst into the process chamber 201. Then, the gaseous substances remaining in the process chamber 201 are removed from the process chamber 201 by the same processing procedure and processing condition as the purging in step A1 (purging). The processing temperature when purging in this step may be the same as the processing temperature when supplying the reactant and the catalyst.

As the reactant containing H and O, for example, a H- and O-containing gas (H- and O-containing substance), which is an oxidizing agent or oxidizing gas, may be used. As the H- and O-containing gas, for example, a water vapor ($H_2O$ gas), a hydrogen peroxide ($H_2O_2$) gas, a hydrogen ($H_2$) gas+oxygen ($O_2$) gas, a $H_2$ gas+ozone ($O_3$) gas, or the like may be used. That is, a H-containing gas+O-containing gas (reducing gas+oxidizing gas) may also be used as the H- and O-containing gas. In this case, a deuterium ($D_2$) gas may be used as the H-containing gas, i.e., the reducing gas instead of the $H_2$ gas. As the reactant containing H and O, one or more selected from the group of these gases may be used.

Joint writing of two gases such as "$H_2$ gas+$O_2$ gas" in the present disclosure means a mixed gas of $H_2$ gas and $O_2$ gas. When a mixed gas is supplied, two gases may be mixed (premixed) in a supply pipe and then supplied into the process chamber 201, or two gases may be supplied into the process chamber 201 separately via different supply pipes and then mixed (post-mixed) in the process chamber 201.

As the catalyst, for example, catalysts similar to the various catalysts exemplified in step A1 described above may be used.

[Performing a Cycle a Predetermined Number of Times]

Figure 4B:
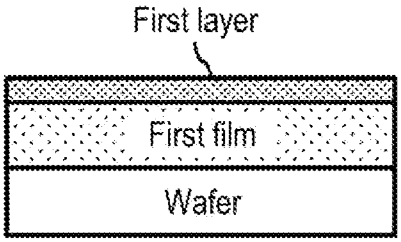
FIG. 4B is a schematic cross-sectional view showing the surface of the wafer after a first layer is formed on the surface of the first film by performing step A in the state of FIG. 4A.

By performing, a predetermined number of times (m times where m is an integer equal to or greater than 1), a cycle in which the above-described steps A1 and A2 are alternately performed non-simultaneously, i.e., without synchronization, a first layer with a desired thickness may be formed (grown) on the surface of the first film of the wafer 200 as shown in FIG. 4B. The above-described cycle may be performed a plurality of times. That is, the thickness of the second precursor layer formed per cycle may be set to be smaller than a desired thickness, and the above-described cycle may be performed a plurality of times until the thickness of the first layer formed by stacking the second precursor layer reaches the desired thickness.

The first layer formed by performing the above-described cycle a predetermined number of times may generate, when etched in step B described below, a substance X that reacts with the etching agent but does not contribute alone to the etching. In step B, the first layer and at least a portion of the first film are etched by using a mixture of the substance X generated from the first layer and the etching agent. Therefore, it may be said that the first layer is an etching promotion layer for the first film, and further that the first layer performs an etching promotion action for the first film.

For example, when the precursor, the reactant, and the catalyst described above are used, the first layer containing H and O may be formed on the surface of the first film by performing the above-described cycle a predetermined number of times. H and O in the first layer may be contained in the first layer as a compound containing H and O. That is, the first layer may contain a compound containing H and O. The first layer containing H and O may contain, for example, $H_2O$ as the compound containing H and O. That is, the first layer may contain H and O, specifically a compound containing H and O, and more specifically $H_2O$. Since the first layer contains H and O, specifically $H_2O$, when the first layer is etched in step B described below, it is possible to efficiently generate the substance X that reacts with the etching agent but does not contribute alone to the etching.

When the first layer contains $H_2O$ as a compound containing H and O as described above, the $H_2O$ molecules contained in the first layer are held in the first layer by, for example, being hydrogen-bonded with other components (molecules) in the first layer. Therefore, it is considered that, when the first layer in which $H_2O$ molecules are held is etched, the above-mentioned hydrogen bonds are broken and the $H_2O$ molecules are desorbed as a gas from the first layer and released. Thus, $H_2O$ contained in the first layer is generated from the first layer as the substance X when the first layer is etched in step B described below. That is, when the first layer containing $H_2O$ is etched, $H_2O$ is generated as the substance X. The $H_2O$ molecules in the first layer may permeate, as a liquid, the surface of the first layer when the first layer is etched or in other cases.

Further, when the first layer contains $H_2O$, an amount of $H_2O$ contained in the first layer may be larger than an amount of $H_2O$ contained in the first film. As a result, when etching the first film, more precisely when starting the etching of the first film, it is possible to generate the substance X (here, $H_2O$) in an amount exceeding an amount of the substance X (here, $H_2O$) generated when etching the first film in step B described below. This makes it possible to further promote the etching of the first film. This case also includes a case where the amount of $H_2O$ contained in the first film is zero, i.e., a case where the first film does not contain $H_2O$. In this case, by allowing the first layer to contain even a small amount of $H_2O$, the amount of $H_2O$ contained in the first layer may be made larger than the amount of $H_2O$ contained in the first film.

Further, for example, when the precursor, the reactant, and the catalyst described above are used, by performing the above-described cycle a predetermined number of times, a silicon oxide layer (SiO layer) or a silicon oxycarbide layer (SiOC layer), which is an oxide layer, may be formed as a first layer on the surface of the first film. In a case where the first layer is an oxide layer, it is possible to generate the substance X by causing the etching agent to chemically react with the first layer when etching the first layer in step B described below. In this case, the oxide layer may contain $H_2O$ as a compound containing H and O. That is, in this case, an oxide layer containing $H_2O$ may be formed as a first layer on the surface of the first film. In a case where the first layer is an oxide layer containing $H_2O$, when the first layer is etched, the substance X (here, $H_2O$) may be efficiently generated by allowing the substance X to be desorbed and released from the first layer, and the substance X (here, $H_2O$) may also be generated by a chemical reaction between the first layer and the etching agent during etching.

As described above, when an oxide layer containing $H_2O$ is formed as the first layer and when the first layer is etched, the substance X desorbed from the first layer and the substance X formed by the chemical reaction between the first layer and the etching agent are generated. In this case, the amount of the substance X generated during etching of the first layer may be made large as compared with a case of forming the first layer in which the substance X is not generated by a chemical reaction with the etching agent. As a result, when etching the first film, more precisely, at the start of etching of the first film, a larger amount of the substance X exists. This makes it possible to further promote the etching of the first film.

In this step, the first layer with a desired thickness may be obtained by regulating a processing time when forming the first layer, i.e., the number of execution times of the above-described cycle. An amount of etching of the first film in step B described below may be controlled by the thickness of the first layer formed in this step. This is because the amount of the substance X generated from the first layer when etching the first layer can be changed by the thickness of the first layer. For example, in a case of the first layer with the same composition, as the thickness of the first layer is increased, the amount of the substance X generated from the first layer is increased, and as the thickness of the first layer is decreased, the amount of the substance X generated from the first layer is decreased. By increasing the thickness of the first layer and increasing the amount of the substance X generated from the first layer, it is possible to further promote the etching of the first film. In addition, by changing the thickness of the first layer, it is possible to regulate the amount of the substance X generated from the first layer and control the amount of etching of the first film. As a result, it is possible to further improve the controllability and uniformity of the etching amount of the first film.

The processing temperature in this step, i.e., the processing temperature when forming the first layer may be lower than the processing temperature when forming the first film. By doing so, for example, as described above, it becomes easy to make the amount of $H_2O$ contained in the first layer larger than the amount of $H_2O$ contained in the first film. This is because as the processing temperature is decreased, it is easier for $H_2O$ to be introduced into the layer or film, and as the processing temperature is increased, it is more difficult for $H_2O$ to be introduced into the layer or film. In this way, by making the processing temperature when forming the first layer lower than the processing temperature when forming the first film, the amount of $H_2O$ contained in the first layer, i.e., the amount of the substance X may be made larger than that in the first film. As a result, when etching the first film, more precisely, at the start of etching of the first film, the substance X may be generated in an amount exceeding the amount of the substance X generated when etching the first film. This makes it possible to further promote the etching of the first film.

When the processing temperature when forming the first layer is lower than the processing temperature when forming the first film, the first layer may contain H and O, may contain $H_2O$, may be an oxide layer, or may be an oxide layer containing $H_2O$. Moreover, the first film described above may include an O-containing film, or may include an O-free film. For example, in this step, the processing temperature when forming the first layer, which is an oxide layer containing $H_2O$, may be made lower than the processing temperature when forming the first film, which is an O-containing film.

(Step B)

In step B, the first layer and at least portion of the first film are etched by supplying an etching agent to the wafer 200 after performing step A. In this step, a substance X that reacts with the etching agent but does not contribute alone to the etching is generated when etching the first layer, and the first layer and at least a portion of the first film are etched by using a mixture of the substance X and the etching agent.

Specifically, the valve 243*e* is opened to allow the etching agent to flow through the gas supply pipe 232*e*. The flow rate of the etching agent is regulated by the MFC 241*e*. The etching agent is supplied into the process chamber 201 via the gas supply pipe 232*b* and the nozzle 249*b*, and is exhausted via the exhaust port 231*a*. In this operation, the etching agent is supplied to the wafer 200 from the lateral side of the wafer 200 (etching agent supply). At this time, the valves 243*f* to 243*h* may be opened to supply the inert gas into the process chamber 201 via the nozzles 249*a* to 249*c* respectively.

Figure 4C:
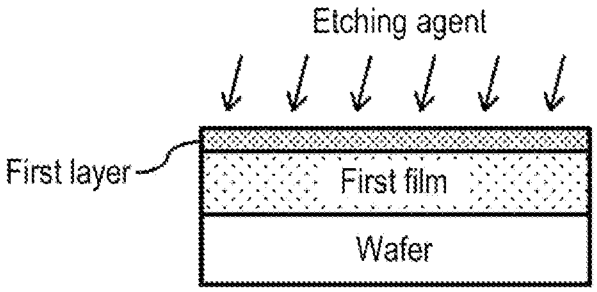
FIG. 4C is a schematic cross-sectional view showing the surface of the wafer when an etching agent is supplied to the wafer including the first layer formed on the surface of the first film by starting step B in the state of FIG. 4B.
Figure 4D:
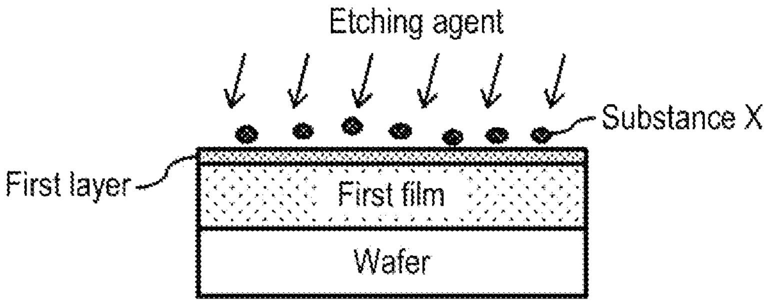
FIG. 4D is a schematic cross-sectional view showing the surface of the wafer when the first layer is etched by continuously performing step B in the state of FIG. 4C and a substance X that reacts with the etching agent but does not contribute alone to the etching is generated.
Figure 4E:
FIG. 4E is a schematic cross-sectional view showing the surface of the wafer after the first layer and a portion of the first film are etched by using a mixture of the substance X and the etching agent by further continuously performing step B in the state of FIG. 4D.

By supplying the etching agent to the wafer 200 as shown in FIG. 4C under the processing condition described below, the etching of the first layer formed on the surface of the first film is started. When the etching of the first layer is started, as shown in FIG. 4D, the substance X is released as a gas from the first layer, and the released substance X is mixed with the etching agent supplied to the wafer 200. In the mixture of the substance X and the etching agent thus obtained, the substance X reacts with the etching agent to generate an activated etching agent, thereby sequentially etching the first layer and then the first film. By continuing the etching with the mixture of the substance X and the etching agent, the first layer and a portion of the first film are etched as shown in FIG. 4E.

As described above, the substance X is a substance that does not contribute alone to the etching but can promote the etching by reacting with an etching agent. In other words, the substance X may be said to be a substance that promotes etching by reacting with an etching agent, and may also be said to be a substance that activates an etching agent. The substance X may contain a liquid as well as the gas released from the first layer. For example, in a case where the substance X permeates, as a liquid, the surface of the first layer when etching the first layer, the first layer and at least a portion of the first film may be etched by using a mixture of the liquid substance X and the etching agent supplied to the wafer 200.

The substance X is continuously generated from the first layer during the etching of the first layer. As a result, even when the etching of the first film is started after the first layer is etched and disappeared, the substance X generated from the first layer remains, and the etching agent supplied to the wafer 200 may be activated by the substance X. As a result, the etching of the first film proceeds until a ratio of the substance X in the mixture becomes zero. That is, in this step, by activating the etching agent supplied to the wafer 200 with the substance X generated when etching the first layer, at least a portion of the first film may be etched in addition to the first layer. Even in a case where the first film is a film that cannot be directly etched with an etching agent or a film that is difficult to etch directly with an etching agent, at least a portion of the first film may be etched.

In this step, the substance X generated when etching the first layer may contain H and O, specifically $H_2O$. When the substance X contains H and O, specifically $H_2O$, the etching agent may be activated efficiently, and the etching of the first film may be further promoted. As a result, the etching of the first film may be performed more stably.

A processing condition when supplying the etching agent in step B is exemplified as follows.

Processing temperature: room temperature (25 degrees C.) to 300 degrees C., specifically room temperature to 200 degrees C.

Processing pressure: 1 to 1333 Pa

Etching agent supply flow rate: 0.001 to 2 slm

Etching agent supply time: 1 second to 100 minutes, specifically 1 minute to 60 minutes Inert gas supply flow rate (for each gas supply pipe): 0 to 20 slm After the etching of the first layer and at least a portion of the first film is completed, the valve 243*e* is closed to stop the supply of the etching agent into the process chamber 201. Then, the gaseous substances remaining in the process chamber 201 are removed from the process chamber 201 by the same processing procedure and processing condition as the purging in step A1 (purging). The processing temperature when purging in this step may be the same as the processing temperature when supplying the etching agent.

The processing temperature in step B may be the same as the processing temperature in step A. In that case, a time for changing the processing temperature may be reduced, and a throughput of substrate processing may be improved.

As the etching agent, for example, a fluorine (F)-gas may be used. Examples of the F-containing gas may include a chlorine trifluoride ($ClF_3$) gas, a chlorine fluoride (ClF) gas, a nitrogen fluoride (NF 3) gas, a hydrogen fluoride (HF) gas, a fluorine ($F_2$) gas, and the like. Further, as the etching agent, for example, a H- and F-containing gas may be used. Examples of the H- and F-containing gas include a HF gas. The HF gas is an F-containing gas, and is also a H- and F-containing gas. One or more selected from the group of these gases may be used as the etching agent.

When the etching agent is a F-containing gas, it is possible to efficiently generate the substance X when etching the first layer. Further, when the etching agent is a H- and F-containing gas, it is possible to generate the substance X by a chemical reaction between etching agent and the first layer during the etching as well as to efficiently generate the substance X when etching the first layer. The first layer described above may contain H and O, may contain $H_2O$, may be an oxide layer, or may be an oxide layer containing $H_2O$. For example, in a case where the etching agent is a H- and F-containing gas, when etching the first layer, which is an oxide layer containing $H_2O$, it is possible to generate $H_2O$ as the substance X by the chemical reaction between the etching agent and the first layer during the etching as well as to efficiently generate $H_2O$ as the substance X by desorbing $H_2O$ from the first layer.

Now, as an example, description will be made on etching when the substance X is $H_2O$, the etching agent is HF, and the first film is a SiO film. In this example, the chemical reaction shown below occurs between $H_2O$, which is the substance X, and HF, which is the etching agent. $H_2O$ and HF are ionized to generate an activated etching agent (HF 2). Then, the following chemical reaction occurs among the $SiO_2$ film, which is the first film, the activated etching agent ($HF_2^-$), and $H_3O^+$, and etching proceeds.

$$2HF+H_2O \leftrightarrows H_3O^+ + HF_2^-$$

$$SiO_2+2H_3O^+2HF_2^- \leftrightarrows SiF_4+4H_2O \qquad \text{[Chemical Reaction 1]}$$

As described above, when the mixture of the substance X and the etching agent is used, the substance X and the etching agent react to generate an activated etching agent, whereby the first film may be etched. Thus, when etching the first film, the substance X may be used together with the etching agent. Therefore, when etching the first film, in a case where a ratio of the substance X in the mixture becomes zero, i.e., in a case the etching agent alone is supplied to the wafer 200, the etching of the first film is stopped. In other words, it may be said that the etching of the first film proceeds until the ratio of the substance X in the mixture becomes zero. Therefore, in step A, an oxide layer containing $H_2O$ is formed as the first layer to generate a larger amount of substance X from the first layer, which makes it possible to further promote the etching of the first film.

In this step, a substance X may be generated even when etching at least a portion of the first film. For example, in a case where the first film includes an O-containing film such as a SiO film or the like, as in the first layer, a substance X (e.g., $H_2O$) may be generated when etching the first film. In other words, when the first film, which is an O-containing film, is etched by using a mixture of the substance X and the etching agent, the first film, which is an O-containing film, is etched and a substance X may be generated by a chemical reaction with the etching agent. Therefore, in a case where the first film includes an O-containing film, the substance X continues to be generated when etching the first film, and the ratio of the substance X in the mixture does not become zero. Thus, the etching reaction is unsaturated, and the etching of the first film may be further promoted. In this case, it is possible to etch the entire first film.

Further, in this step, it is possible to prevent the substance X from being generated when etching at least a portion of the first film. For example, in a case where the first film includes an O-free film such as a SiN film or the like, a substance X (e.g., $H_2O$) may be prevented from being generated when etching the first film. In other words, when the first film, which is an O-free film, is etched by using a mixture of the substance X and the etching agent, the ratio of the substance X in the mixture is gradually decreased. Then, as long as the ratio of the substance X in the mixture is not zero, the etching proceeds. The etching is stopped when the ratio of the substance X in the mixture becomes zero. Therefore, in a case where the first film includes an O-free film, the etching reaction may be saturated in this step, and the controllability and uniformity of the etching amount may be further enhanced.

In this step, even in a case where a substance X is generated from the first film, saturation characteristics (saturation or unsaturation) of the etching reaction of the first film may be controlled by controlling a balance between a generation rate of the substance X from the first film and a desorption rate of the substance X, which is generated from the first film, from a reaction system. In this regard, the desorption rate of the substance X, which is generated from the first film, from the reaction system refers to a rate at which the substance X generated from the first film is desorbed from the reaction system without reacting with the etching agent.

For example, in a case where a processing condition (e.g., a first processing temperature) is set such that the generation rate of the substance X from the first film is smaller than the desorption rate of the substance X, which is generated from the first film, from the reaction system, and the generation rate of the substance X from the first film is set to be smaller than the desorption rate of the substance X, which is generated from the first film, from the reaction system, it is possible to saturate the etching reaction of the first film. In this case, when the first film is etched by using a mixture of the substance X and the etching agent, a substance X is generated from the first film. However, most of the substance X is desorbed from the reaction system without contributing to the reaction with the etching agent. As a result, as the etching proceeds, the ratio of the substance X in the mixture gradually decreases. As long as the ratio of the substance X in the mixture is not zero, the etching proceeds. The etching is stopped when the ratio of the substance X in the mixture becomes zero. That is, an etching reaction similar to that when the first film includes an O-free film occurs. As described above, the etching reaction may be saturated by setting a generation rate of the substance X from the first film to be smaller than the desorption rate of the substance X, which is generated from the first film, from the reaction system, and the controllability and uniformity of the etched amount may be enhanced.

Moreover, for example, in a case where a processing condition (e.g., a second processing temperature lower than the above-described first processing temperature) is set such that the generation rate of the substance X from the first film is larger than the desorption rate of the substance X, which is generated from the first film, from the reaction system, and the generation rate of the substance X from the first film is set to be larger than the desorption rate of the substance X, which is generated from the first film, from the reaction system, it is possible to make the etching reaction of the first film unsaturated. In this case, among the substance X generated from the first film, the ratio of the substance X reacting with the etching agent exceeds the ratio of the substance X desorbed from the reaction system without reacting with the etching agent. As a result, the substance X continues to be generated when etching the first film, and the ratio of the substance X in the mixture does not become zero. Thus, the etching reaction becomes unsaturated, and the etching continues to proceed. As described above, the etching reaction may be made unsaturated by setting the generation rate of the substance X from the first film to be larger than the desorption rate of the substance X, which is generated from the first film, from the reaction system, so that the reaction between the etching agent and the substance X continues to occur. This makes it possible to further promote the etching of the first film.

(Performing a Cycle a Predetermined Number of Times)

By performing, a predetermined number of times (n times where m is an integer equal to or greater than 1), a cycle in which the above-described steps A and B are alternately performed non-simultaneously, i.e., without synchronization, a portion of the first film, which is an etching target film, is etched. The above-described cycle may be performed a plurality of times. That is, the thickness of the first film etched per cycle may set to be smaller than a desired etching thickness of the first film, and the above-described cycle may be performed a plurality of times until the etching thickness of the first film reaches the desired thickness (depth). The entire first film may be etched by performing the above-described cycle a plurality of times.

(After-Purge and Returning to Atmospheric Pressure)

After the etching is completed, i.e., after the annealing is completed, an inert gas as a purge gas is supplied into the process chamber 201 from each of the nozzles 249*a* to 249*c* and exhausted via the exhaust port 231*a*. Thus, the inside of the process chamber 201 is purged such that gases remaining in the process chamber 201, reaction by-products, and the like are removed from the inside of the process chamber 201 (after-purge). Thereafter, the internal atmosphere in the process chamber 201 is replaced with an inert gas (inert gas replacement), and the internal pressure of the process chamber 201 is returned to the atmospheric pressure (returning to atmospheric pressure).

(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219*s* is moved and the lower end opening of the manifold 209 is sealed by the shutter 219*s* via the O-ring 220*c* (shutter closing). The processed wafers 200 are discharged out of the boat 217 after being unloaded from the reaction tube 203 (wafer discharging).

Steps A and B may be performed in the same process chamber (in-situ). By doing so, after the first layer is formed on the surface of the first film of the wafer 200 in step A, step B may be performed without exposing the wafer 200 to the atmosphere, i.e., while keeping the surface of the wafer 200 clean, and the etching of the first film, which is an etching target film, may be properly performed.

(3) Effects of the Embodiments

According to the embodiments of the present disclosure, one or more selected from the group of the following effects may be obtained.

In step B, the first layer and at least a portion of the first film are etched by supplying the etching agent to the wafer 200 after the first layer (etching promotion layer) is formed on the surface of the first film which is an etching target film (film to be etched). In this step, a substance X, which reacts with the etching agent but does not contribute alone to etching, is generated when etching the first layer, and the first layer and at least a portion of the first film are etched by using a mixture of this substance X and the etching agent. By doing so, even in a case where the first film is a film of a low reactivity with the etching agent and may not be directly etched by the etching agent alone, or a film that is difficult to directly etch with the etching agent alone, it is possible to sufficiently etch the first film. That is, it is possible to promote the etching of the first film, which is an etching target film. In addition, it becomes possible to perform stable etching with good controllability on the first film, which is an etching target film, and to improve the controllability and uniformity of the etching amount of the first film.

In step A, a precursor and a reactant containing H and O are supplied as processing agents to the wafer 200. Specifically, in step A, a cycle of alternately performing step A1 of supplying a precursor to the wafer 200 and step A2 of supplying a reactant containing H and O to the wafer 200 is performed a predetermined number of times. In at least one selected from the group of step A1 and step A2, a catalyst is supplied to the wafer 200. By doing so, H and O, specifically $H_2O$, may be effectively contained in the first layer. That is, a first layer containing H and O, specifically $H_2O$ may be formed by step A. As a result, when etching the first layer, it is possible to efficiently generate the substance X which reacts with the etching agent but does not contribute alone to the etching, thereby promoting the etching of the first film. In addition, in step A, the supply of the catalyst may be omitted depending on the processing condition.

The first layer, which is an oxide layer containing $H_2O$ may also be formed by step A. Thus, it is possible to generate the substance X by the chemical reaction between the first layer and the etching agent during the etching as well as to efficiently generate the substance X by desorbing the substance X from the first layer when etching the first layer. As a result, a substance X in an amount exceeding the amount of substance X generated when etching the first film may be generated when etching the first film, more precisely at the start of etching of the first film. This makes it possible to promote the etching of the first film.

Since the substance X is a substance that promotes etching by reacting with the etching agent, even in a case where the first film is a film that cannot be directly etched by the etching agent alone, or a film that is difficult to directly etch with the etching agent alone, it is possible to etch the first film. That is, it is possible to promote the etching of the first film, which is an etching target film. In addition, it becomes possible to perform stable etching with good controllability on the first film, which is an etching target film, and to improve the controllability and uniformity of the etching amount of the first film. In particular, when the substance X, which promotes etching by reacting with the etching agent, contains H and O, specifically $H_2O$, these effects may be further enhanced.

(4) Modifications

The surface of the wafer 200 and the processing sequence according to the embodiments of the present disclosure may be changed as in modifications shown below. These modifications may be combined arbitrarily. Unless otherwise specified, a processing procedure and a processing condition in each step of each modification may be the same as the processing procedure and processing condition in each step of the substrate processing sequence described above.

First Modification

Figure 5A:
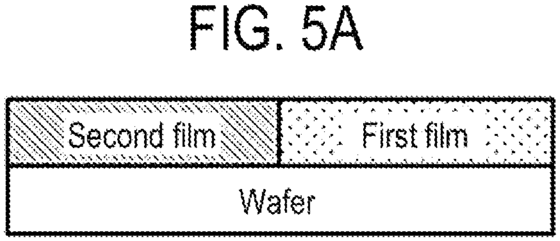
FIG. 5A is a schematic cross-sectional view showing a surface of a wafer including a first film and a second film on its surface.

As shown in FIG. 5A, the wafer 200 may include a first film and a second film on the surface thereof. That is, the wafer 200 may include a second film in addition to the first film on the surface thereof. In that case, as in the processing sequence shown below, before step A is performed, step C of forming an inhibitor layer as a second layer on the surface of the second film by supplying a modifying agent to the wafer 200 may be further performed. The processing sequences indicated below shows an example in which step C is performed once before a cycle including steps A and B is performed a predetermined number of times. In this modification, the first film may be selectively etched out of the first film to be etched and the second film not to be etched on the surface of the wafer 200.

Modifying agent→[(precursor+catalyst→reactant+catalyst)×*m*→etching agent]×*n*

Modifying agent→[(precursor+catalyst→reactant)×*m*→etching agent]×*n*

Modifying agent→[(precursor→reactant+catalyst)×*m*→etching agent]×*n*

An example of the processing sequence according to this modification will be described mainly with reference to FIGS. 5A to 5F. In the following, for the sake of convenience, as a representative example, there will be described a case where the first film (etching target film) is a SiN film as an O-free film, and the second film (non-etching target film) is a SiO film as an O-containing film.

(Step C)

Just like the processing sequence of the above-described embodiments of the present disclosure, step C is performed after wafer charging, boat loading, pressure regulation, and temperature regulation are performed. In step C, a modifying agent is supplied to a wafer 200 including a first film and a second film on its surface as shown in FIG. 5A, thereby forming an inhibitor layer as a second layer on the surface of the second film.

Specifically, the valve 243*a* is opened to allow the modifying agent to flow through the gas supply pipe 232*a*. The flow rate of the modifying agent is regulated by the MFC 241*a*. The modifying agent is supplied into the process chamber 201 via the nozzle 249*a*, and exhausted via the exhaust port 231*a*. At this time, the modifying agent is supplied to the wafer 200 from the lateral side of the wafer 200 (modifying agent supply). At this time, the valves 243*f* to 243*h* may be opened to supply the inert gas into the process chamber 201 via the nozzles 249*a* to 249*c*.

Figure 5B:
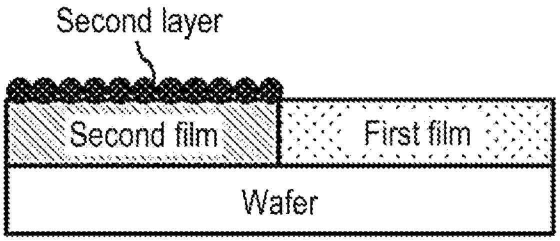
FIG. 5B is a schematic cross-sectional view showing the surface of the wafer after an inhibitor layer as a second layer is selectively formed on the surface of the second film by performing step C in the state of FIG. 5A.

By supplying the modifying agent to the wafer 200 under the processing condition described below, inhibitor molecules, which are at least a portion of the molecular structures of the molecules constituting the modifying agent, are selectively chemisorbed on the surface of the second film of the wafer 200 such that a second layer (inhibitor layer) may be selectively formed on the surface of the second film as shown in FIG. 5B. The inhibitor layer may be said to be a reaction-inhibiting layer (adsorption-inhibiting layer) because it may act to inhibit the reaction that forms the first layer. The inhibitor layer formed in this step contains at least a portion of the molecular structures of the molecules constituting the modifying agent, which is a residue derived from the modifying agent. In step A, the inhibitor layer prevents adsorption of the precursor (processing agent) on the surface of the second film, and inhibits (suppresses) formation of the first layer on the surface of the second film. In addition, the inhibitor layer is a layer covering the surface of the second film, and may inhibit (suppress) the etching of the second film in step B. The second layer may be referred to as an etching inhibition layer because it may perform an etching inhibition action as described above.

At least a portion of the molecular structures of the molecules constituting the modifying agent, i.e., the inhibitor molecule may be exemplified by a trialkylsilyl group such as a trimethylsilyl group (—$SiMe_3$) or a triethylsilyl group (—$SiEt_3$). The trialkylsilyl group includes an alkyl group, which is a type of hydrocarbon group. In a case where the inhibitor molecule contains these groups, Si of the trimethylsilyl group or the triethylsilyl group is adsorbed on adsorption sites on the surface of the second film of the wafer 200. In a case where the second film is a SiO film, the surface of the second film contains an OH termination (OH group) as the adsorption site, and Si of the trimethylsilyl group and the triethylsilyl group is bonded to O of the OH termination (OH group) on the surface of the second film, such that the surface of the second film is terminated with an alkyl group such as a methyl group or an ethyl group. A hydrocarbon group typified by an alkyl group (alkylsilyl group) such as a methyl group (trimethylsilyl group) or an ethyl group (triethylsilyl group) terminated on the surface of the second film constitutes an inhibitor layer. In step A, the hydrocarbon group may inhibit (suppress) adsorption of the precursor (processing agent) on the surface of the second film, and may inhibit (suppress) the progress of the reaction of forming the first layer on the surface of the second film. In addition, the hydrocarbon group terminating the surface of the second film may inhibit (suppress) the etching of the second film in step B.

In a case where the inhibitor molecule adsorbed on the adsorption site on the surface of the second film is a trialkylsilyl group such as a trimethylsilyl group (—$SiMe_3$) or a triethylsilyl group (—$SiEt_3$), the inhibitor molecule contains an alkyl group (alkylsilyl group) and the inhibitor layer contains an alkyl group (alkylsilyl group) termination. In a case where the inhibitor layer contains a hydrocarbon group termination such as an alkyl group (alkylsilyl group) termination or the like, a high reaction-inhibiting effect (adsorption-inhibiting effect) is obtained. The alkyl group (alkylsilyl group) termination and the hydrocarbon group termination are also referred to as an alkyl (alkylsilyl) termination and a hydrocarbon termination, respectively.

In this step, at least a portion of the molecular structures of the molecules constituting the modifying agent may be adsorbed on a portion of the surface of the first film of the wafer 200. However, an adsorption amount on the surface of the first film of the wafer 200 is very small, and an adsorption amount on the surface of the second film of the wafer 200 is overwhelmingly larger. The reason why such selective (preferential) adsorption is possible is that the processing condition in this step is set such that the modifying agent does not decompose in a gas phase within the process chamber 201. Further, this is because, while the surface of the second film, which is the SiO film, is OH-terminated over its entire surface, most region of the surface of the first film, which is the SiN film, is not OH-terminated. In this step, since the modifying agent does not decompose in a gas phase within the process chamber 201, at least a portion of the molecular structures of the molecules constituting the modifying agent are not multi-deposited on the surface of the first film and the surface of the second film. At least a portion of the molecular structures of the molecules constituting the modifying agent are selectively adsorbed on the surface of the second film out of the surface of the first film and the surface of the second film, whereby the surface of the second film is selectively terminated with at least a portion of the molecular structures of the molecules constituting the modifying agent.

A processing condition when supplying the modifying agent in step C is exemplified as follows.

Processing temperature: room temperature (25 degrees C.) to 500 degrees C., specifically room temperature to 250 degrees C.

Processing pressure: 5 to 2000 Pa, specifically 10 to 1000 Pa

Modifying agent supply flow rate: 0.001 to 3 slm, specifically 0.001 to 0.5 slm

Modifying agent supply time: 1 second to 120 minutes, specifically 30 seconds to 60 minutes Inert gas supply flow rate (for each gas supply pipe): 0 to 20 slm The processing temperature in step C may be the same as the processing temperature in step A and the processing temperature in step B. In that case, a time for changing the processing temperature may be reduced, and a throughput of substrate processing may be improved.

After selectively forming the inhibitor layer on the surface of the second film of the wafer 200, the valve **243*a* is closed to stop the supply of the modifying agent into the process chamber 201. Then, the gaseous substances remaining in the process chamber 201 are removed from the process chamber 201** by the same processing procedure and processing condition as in the purging performed in step A1 (purging). The processing temperature when purging in this step may be the same as the processing temperature when supplying the modifying agent.

As the modifying agent, for example, a compound with a structure in which an amino group is directly bonded to Si or a compound with a structure in which an amino group and an alkyl group are directly bonded to Si may be used. The amino group in these compounds may be a substituted amino group substituted with an alkyl group such as a methyl group or an ethyl group.

Examples of the modifying agent may include (dimethylamino)trimethylsilane ($(CH_3)_2NSi(CH_3)_3$), (diethylamino)triethylsilane ($(C_2H_5)_2NSi(C_2H_5)_3$), (dimethylamino)triethylsilane ($(CH_3)_2NSi(C_2H_5)_3$), (diethylamino) trimethylsilane ($(C_2H_5)_2NSi(CH_3)_3$), (dipropylamino) trimethylsilane ($(C_3H_7)_2NSi(CH_3)_3$), (dibutylamino) trimethylsilane ($(C_4H_9)_2NSi(CH_3)_3$), (trimethylsilyl)amine ($(CH_3)_3SiNH_2$), (triethylsilyl)amine ($(C_2H_5)_3SiNH_2$), (dimethylamino)silane ($(CH_3)_2NSiH_3$), (diethylamino)silane ($(C_2H_5)_2NSiH_3$), (dipropylamino)silane ($(C_3H_7)_2NSiH_3$), (dibutylamino)silane ($(C_4H_9)_2NSiH_3$), and the like. One or more selected from the group of these substances may be used as the modifying agent.

In addition, examples of the modifying agent may include bis(dimethylamino)dimethylsilane ($[(CH_3)_2N]_2Si(CH_3)_2$), bis(diethylamino)diethylsilane ($[(C_2H_5)_2N]_2Si(C_2H_5)_2$), bis (dimethylamino)diethylsilane ($[(CH_3)_2N]_2Si(C_2H_5)_2$), bis (diethylamino)dimethylsilane ($[(C_2H_5)_2N]_2Si(CH_3)_2$), bis (dimethylamino)silane ($[(CH_3)_2N]_2SiH_2$), bis (diethylamino)silane ($[(C_2H_5)_2N]_2SiH_2$), bis(dimethylaminodimethylsilyl)ethane ($[(CH_3)_2N(CH_3)_2Si]_2C_2H_6$), bis (dipropylamino)silane ($[(C_3H_7)_2N]_2SiH_2$), bis(dibutylamino)silane ($[(C_4H_9)_2N]_2SiH_2$), bis(dipropylamino) dimethylsilane ($[(C_3H_7)_2N]_2Si(CH_3)_2$), bis(dipropylamino) diethylsilane ($[(C_3H_7)_2N]_2Si(C_2H_5)_2$), (dimethylsilyl) diamine ($(CH_3)_2Si(NH_2)_2$), (diethylsilyl)diamine ($(C_2H_5)_2Si(NH_2)_2$), (dipropylsilyl)diamine ($(C_3H_7)_2Si(NH_2)_2$), bis (dimethylaminodimethylsilyl)methane ($[(CH_3)_2N(CH_3)_2Si]_2CH_2$), bis(dimethylamino)tetramethyldisilane ($[(CH_3)_2N]_2(CH_3)_4Si_2$), and the like. One or more selected from the group of these substances may be used as the modifying agent.

Figure 5C:
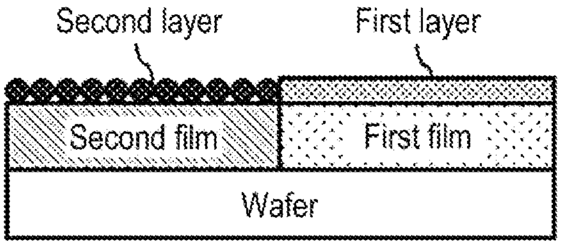
FIG. 5C is a schematic cross-sectional view showing the surface of the wafer after a first layer is selectively formed on the surface of the first film by performing step A in the state of FIG. 5B.
Figure 5D:
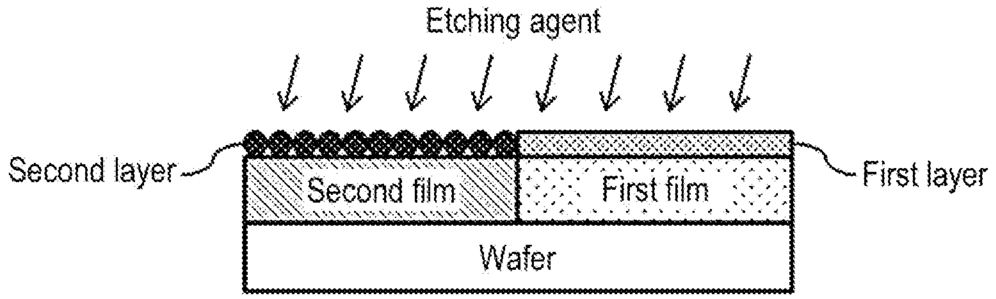
FIG. 5D is a schematic cross-sectional view showing the surface of the wafer when a second layer is formed on the surface of the second film and an etching agent is supplied to the wafer including the first layer formed on the surface of the first film by starting step B in the state of FIG. 5C.
Figure 5E:
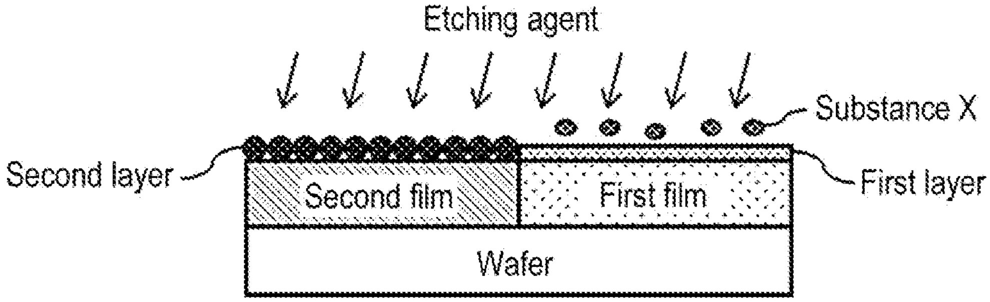
FIG. 5E is a schematic cross-sectional view showing the surface of the wafer when the first layer is etched by continuously performing step B in the state of FIG. 5D and a substance X that reacts with the etching agent but does not contribute alone to the etching is generated.
Figure 5F:
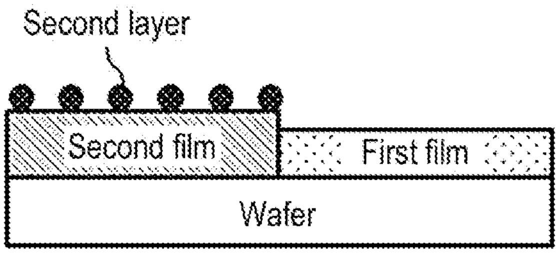
FIG. 5F is a schematic cross-sectional view showing the surface of the wafer after the first layer and a portion of the first film are etched by using a mixture of the substance X and the etching agent by further continuously performing step B in the state of FIG. 5E.

After step C is completed, a cycle including step A and step B is performed a predetermined number of times (n times where n is an integer equal to or greater than 1) in the same manner as in the processing sequence of the embodiments described above. In step A, as shown in FIG. 5C, a first layer is formed on the surface of the first film by supplying a processing agent to the wafer 200 including the second layer (inhibitor layer) formed on the surface of the second film. Further, in step B, when the etching agent is supplied to the wafer 200 as shown in FIG. 5D, a substance X is generated from the first layer as shown in FIG. 5E. The first layer and at least a portion of the first film are etched by using a mixture of the substance X generated from the first layer and the etching agent supplied to the wafer 200. By completing step B, a portion of the second layer, the first layer, and at least a portion of the first film are etched as shown in FIG. 5F. The above-described cycle may be performed a plurality of times as in the above-described embodiments. Further, as in the above-described embodiments, the entire first film may be etched by performing the above-described cycle a plurality of times.

The processing procedure and processing condition of step A in this modification may be the same as the processing procedure and processing condition of step A in the processing sequence of the above-described embodiments. Further, the processing procedure and processing condition of step B in this modification may be the same as the processing procedure and processing condition of step B in the processing sequence of the above-described embodiments. In addition, in this modification, wafer charging, boat loading, pressure regulation, temperature regulation, and the like, which are performed before performing step C, and after-purge, inert gas replacement, returning to atmospheric pressure, boat unloading, wafer discharging, and the like, which are performed after performing step B, may be performed in the same manner as in the processing sequence of the above-described embodiments.

Also in this modification, the same effects as in the above-described embodiments may be obtained. Further, according to this modification, the first layer may be selectively formed on the surface of the first film out of the first film and the second film, and the first film out of the first film and the second film may be selectively etched.

(Second Modification)

Step C in the first modification may be performed within a cycle including step A and step B. That is, the cycle including step A and step B may further include step C.

For example, when a cycle including step A and step B is performed a predetermined number of times, step C may be performed every cycle. In this case, as in the processing sequences indicated below, a cycle including step C, step A, and step B is performed a predetermined number of times (n times where n is an integer equal to or greater than 1).

[Modifying agent→(precursor+catalyst→reactant+catalyst)×$m$→etching agent]×$n$

[Modifying agent→(precursor+catalyst→reactant)×$m$→etching agent]×$n$

[Modifying agent→(precursor→reactant+catalyst)×$m$→etching agent]×$n$

Further, for example, as in the processing sequences indicated below, after step C is performed once, a cycle that performs a cycle including step A and step B a predetermined number of times (p times where p is an integer equal to or greater than 2) may be performed a number of times (n times where n is an integer equal to or greater than 1). In this case, step C is performed each time when the cycle including step A and step B is performed a predetermined number of times (p times).

[Modifying agent→{(precursor+catalyst→reactant+catalyst)×$m$→etching agent}×$p$]×$n$

[Modifying agent→{(precursor+catalyst→reactant)×$m$→etching agent}×$p$]×$n$

[Modifying agent→{(precursor→reactant+catalyst)×$m$→etching agent}×$p$]×$n$

Also in this modification, the same effects as in the above-described embodiments and first modification may be obtained. Further, according to this modification, the second layer (inhibitor layer) formed on the surface of the second film may be repaired and/or reinforced each time when step A and step B are performed a predetermined number of times. For example, by performing step A and step B, the second layer may be repaired and/or reinforced each time when the second layer is damaged and its performance is deteriorated. This makes it possible to further enhance the reaction inhibition action and the etching inhibition action of the second layer. As a result, it is possible to enhance the selectivity when etching the first film (etching target film).

(Third Modification)

As in the processing sequences indicated below, step D of cleaning the surface of the wafer 200 with a cleaning agent may be further performed before performing step A or step C. By performing step D, for example, a native oxide film formed on the surface of the wafer 200 before processing may be removed.

Cleaning agent→[(precursor+catalyst→reactant+catalyst)×$m$→etching agent]×$n$

Cleaning agent→[(precursor+catalyst→reactant)×$m$→etching agent]×$n$

Cleaning agent→[(precursor→reactant+catalyst)×$m$→etching agent]×$n$

Cleaning agent→[modifying agent→(precursor+catalyst→reactant+catalyst)×$m$→etching agent]×$n$ Cleaning agent→[modifying agent→(precursor+catalyst→reactant)×$m$→etching agent]×$n$ Cleaning agent→[modifying agent→(precursor→reactant+catalyst)×$m$→etching agent]×$n$ Cleaning agent→[modifying agent→{(precursor+catalyst→reactant+catalyst)×$m$→etching agent}×$p$]×$n$ Cleaning agent→[modifying agent→{(precursor+catalyst→reactant)×$m$→etching agent}×$p$]×$n$ Cleaning agent→[modifying agent→{(precursor→reactant+catalyst)×$m$→etching agent}×$p$]×$n$ The cleaning agent may be a gaseous substance or a liquid substance. Further, the cleaning agent may be a liquid substance such as a mist substance or the like. As the cleaning agent, for example, the aforementioned F-containing gas, an acetic acid ($CH_3COOH$) gas, a formic acid (HCOOH) gas, hexafluoroacetylacetone ($C_5H_2F_6O_2$) gas, a hydrogen ($H_2$) gas, and the like may be used. Further, as the cleaning agent, an aqueous acetic acid solution, an aqueous formic acid solution, various cleaning solutions to be described below, and the like may also be used. One or more selected from the group of them may be used as the cleaning agent.

For example, in step D, DHF cleaning may be performed on the wafer 200 by using an aqueous HF solution as the cleaning agent. Further, for example, in step D, SC-1 cleaning (APM cleaning) may be performed on the wafer 200 by using a cleaning liquid containing ammonia water, hydrogen peroxide water, and pure water as the cleaning agent. Further, for example, in step D, SC-2 cleaning (HPM cleaning) may be performed on the wafer 200 by using a cleaning liquid containing hydrochloric acid, hydrogen peroxide and pure water as the cleaning agent. Further, for example, in step D, SPM cleaning may be performed on the wafer 200 by using a cleaning liquid containing sulfuric acid and hydrogen peroxide as the cleaning agent.

Further, in this modification, the same effects as in the above-described embodiments may be obtained. Further, according to this modification, it is possible to perform more appropriately the formation of the first layer on the surface of the first film and the formation of the second layer (inhibitor layer) on the surface of the second film.

Other Embodiments of the Present Disclosure

The embodiments of the present disclosure are specifically described above. However, the present disclosure is not limited to the embodiments described above, and may be modified in various ways without departing from the spirit of the present disclosure.

For example, as described above, the wafer 200 may include at least one selected from the group of an O-containing film such as a SiO film and an O-free film such as a SiN film as the first film which is an etching target film. The first film may be, for example, a film containing at least Si and at least one selected from the group of O and N. For example, the first film may be a silicon oxycarbonitride film (SiOCN film), a silicon oxynitride film (SiON film), a silicon oxycarbide film (SiOC film), or the like, in addition to the above-described SiO film and SiN film. Further, for example, the wafer 200 may include a plurality of types of regions made of different materials as the first film. In addition, for example, the wafer 200 may include, as the first film, a film including a surface on which an inhibitor layer as a second layer is difficult to be formed. Also in this embodiment, the same effects as in the above-described embodiments may be obtained.

Further, for example, the wafer 200 may include, as the second film which is a non-etching target film, a film including a surface on which an inhibitor layer is easy to be formed as a second layer. The second film may be a film including a surface on which an inhibitor layer is easier to be formed as a second layer than on the first film. The second film may be, in addition to the above-described SiO film, for example, a semiconductor-element-containing film such as a SiOCN film, a SiON film, a SiOC film, a silicon carbonitride film (SiCN film), a silicon carbide film (SiC film), a silicon borocarbonitride film (SiBCN film), a silicon boronitride film (SiBN film), a silicon borocarbide film (SiBC film), a silicon film (Si film), a germanium film (Ge film), a silicon germanium film (SiGe film), or the like, a metal-element-containing film such as a titanium nitride film (TiN film), a tungsten film (W film), a molybdenum film (Mo film), a ruthenium film (Ru film), a cobalt film (Co film), a nickel film (Ni film), a copper film (Cu film), or the like, an amorphous carbon film (a-C film), monocrystalline Si wafer (Si wafer), and so forth. Further, for example, the wafer 200 may include a plurality of types of regions made of different materials as the second film. Also in this embodiment, the same effects as in the above-described embodiments may be obtained.

Further, for example, the combination of the first film (etching target film) and the second film (non-etching target film) of the wafer 200 may be, in addition to the combination of the SiN film as the first film and the SiO film as the second film shown in the first modification, a combination of a SiO film as the first film and a Si film as the second film, a combination of a SiN film as the first film and a Si film as the second film, and the like. Further, the combination of the first film and the second film may be a combination of at least one selected from the group of the various films exemplified as the first film and at least one selected from the group of the various films exemplified as the second film. In this case, the second layer may be more easily formed on the surface of the second film than the first film. Also in this embodiment, the same effects as in the above-described embodiments may be obtained.

The recipe used in each process may be provided separately according to the processing contents and are stored in the memory 121*c* via an electric communication line or an external memory 123. When starting each process, the CPU 121*a* may properly select an appropriate recipe from a plurality of recipes stored in the memory 121*c* according to the process contents. This makes it possible to perform the etching process on the films of various film types, composition ratios, film qualities and film thicknesses with high reproducibility in one substrate processing apparatus. In addition, the burden on an operator may be reduced, and each process may be quickly started while avoiding operation errors.

The above-described recipes are not limited to the newly provided ones, but may be provided by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 installed in the existing substrate processing apparatus may be operated to directly change the existing recipes already installed in the substrate processing apparatus.

In the above-described embodiments, the example is described in which an etching process is performed by using a batch-type substrate processing apparatus configured to process a plurality of substrates at a time. The present disclosure is not limited to the above-described embodiments, but may be suitably applied to, for example, a case where an etching process is performed by using a single-wafer type substrate processing apparatus configured to process one or several substrates at a time. Furthermore, in the above-described embodiments, the example is described in which an etching process is performed by using a substrate processing apparatus including a hot-wall-type process furnace. The present disclosure is not limited to the above-described embodiments but may also be suitably applied to a case where an etching process is performed by using a substrate processing apparatus including a cold-wall-type process furnace.

Even when these substrate processing apparatuses are used, each process may be performed under the processing procedures and processing conditions as those of the above-described embodiments and modifications. The same effects as those of the above-described embodiments and modifications may be obtained.

In addition, the above-described embodiments and modifications may be used in combination as appropriate. The processing procedures and processing conditions at this time may be, for example, the same as the processing procedures and processing conditions of the above-described embodiments and modifications.

EXAMPLES

Examples 1 to 3

A wafer including a SiN film formed by a CVD method as a first film on its surface is subjected to the same process as in step A of the above-described embodiments, and a SiO layer containing $H_2O$ is formed as a first layer on the surface of the first film, whereby evaluation samples 1 to 3 of Examples 1 to 3 are provided. A processing condition in step A when providing evaluation samples 1 to 3 is set to a predetermined condition within the range of the processing condition in step A described above. However, thicknesses of the first layer (SiO layer containing $H_2O$) in evaluation samples 1 to 3 is changed by changing a processing time (number of cycles) in step A when providing evaluation samples 1 to 3. Specifically, the thicknesses of the first layers in evaluation samples 1 to 3 are set to 1 to 3 nm, 4 to 6 nm, and 8 to 10 nm, respectively, by lengthening (increasing) the processing time (number of cycles) in step A when providing evaluation samples 1 to 3 in the order of evaluation samples 1 to 3. When providing any evaluation sample, a processing temperature when forming the first layer is set to be lower than the processing temperature when forming the SiN film by the CVD method. In addition, when providing any evaluation sample, the chlorosilane-based gas exemplified in the above-described embodiments is used as the precursor, the H- and O-containing gas exemplified in the above-described embodiments is used as the reactant containing H and O, and the cyclic amine-based gas exemplified in the above-described embodiments is used as the catalyst.

Examples 4 to 6

A wafer including a SiO film formed by a thermal oxidation method as a first film on its surface is subjected to the same process as in step A of the above-described embodiments, and a SiO layer containing $H_2O$ is formed as a first layer on the surface of the first film, whereby evaluation samples 4 to 6 of Examples 4 to 6 are provided. A processing condition in step A when providing evaluation samples 4 to 6 is set to a predetermined condition within the range of the processing condition in step A described above. However, thicknesses of the first layer (SiO layer containing $H_2O$) in evaluation samples 4 to 6 is changed by changing the processing time (number of cycles) in step A when providing evaluation samples 4 to 6. Specifically, the thicknesses of the first layers in evaluation samples 4 to 6 are set to 1 to 3 nm, 4 to 6 nm, and 8 to 10 nm, respectively, by lengthening (increasing) the processing time (number of cycles) in step A when providing evaluation samples 4 to 6 in the order of evaluation samples 4 to 6. When providing any evaluation sample, the processing temperature when forming the first layer is set to be lower than the processing temperature when forming the SiO film by the thermal oxidation method. In addition, when providing any evaluation sample, the precursor, the reactant containing H and O, and the catalyst are the same as those when providing evaluation samples 1 to 3.

The first film is etched by performing the same processing as in step B of the above-described embodiments on each of the provided evaluation samples, and an etching amount of the first film (SiN film or SiO film) is obtained. A processing condition in step B is set to a predetermined condition within the range of the processing condition in step B of the above-described embodiments. When performing etching, the H- and F-containing gas exemplified in the above-described embodiments is used as an etching agent.

Figure 6:
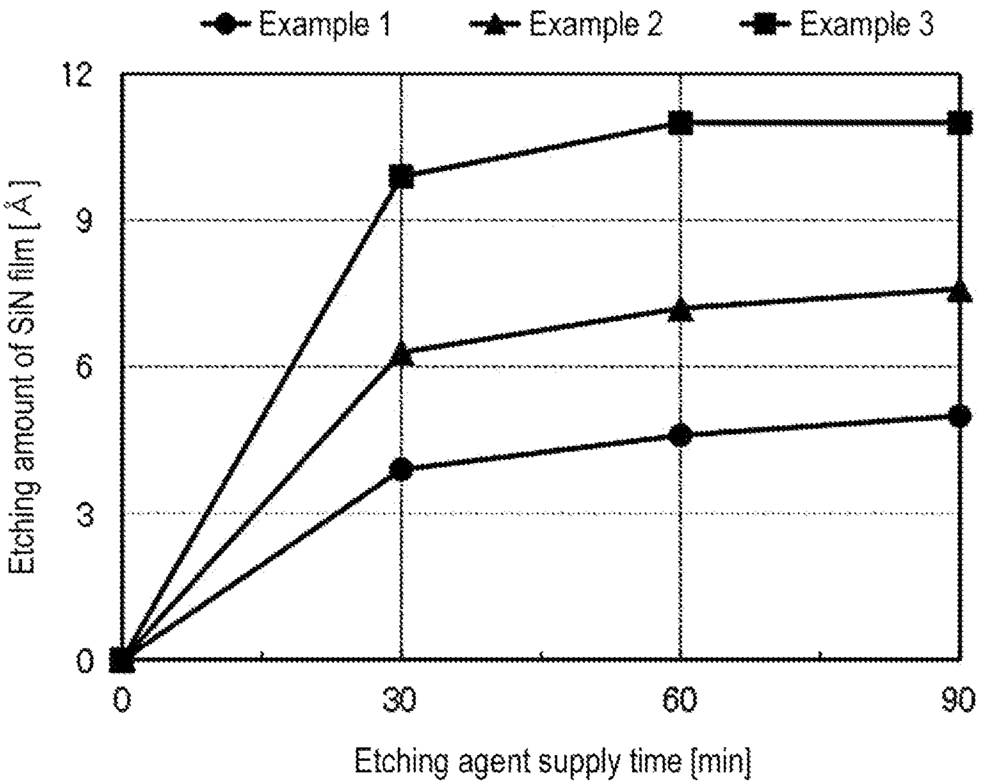
FIG. 6 is a graph showing etching amounts in Examples 1 to 3.
Figure 7:
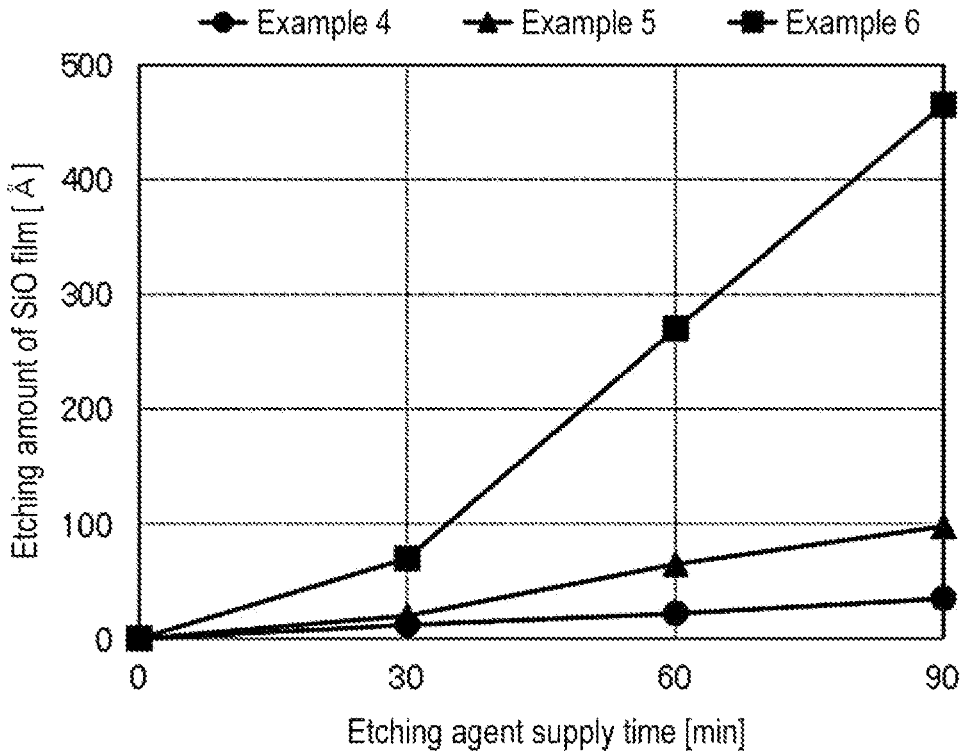
FIG. 7 is a graph showing etching amounts in Examples 4 to 6.

The results for evaluation samples 1 to 3 are shown in FIG. 6 and the results for evaluation samples 4 to 6 are shown in FIG. 7. In FIGS. 6 and 7, a horizontal axis indicates a supply time (min) of the etching agent, and a vertical axis indicates an etching amount (A) of the SiN film or the SiO film.

As is apparent from FIG. 6, the etching amount of evaluation samples 1 to 3 increases as the supply time of the etching agent increases, but the etching amount hardly increases after 60 minutes. When a comparative evaluation sample without the first layer formed on the surface of the SiN film is subjected to the same processing as the processing performed on each of the above-described evaluation samples, it is confirmed that the etching of the SiN film is almost impossible. In other words, it is confirmed that in evaluation samples 1 to 3, it is possible to promote the etching of the first film as compared with the comparative evaluation sample.

As is apparent from FIG. 7, etching amounts of evaluation samples 4 to 6 are less likely to increase as the supply time of the etching agent increases. When a comparative evaluation sample without the first layer formed on the surface of the SiO film is subjected to the same processing as the processing performed on each of the above-described evaluation samples, it is confirmed that the etching of the SiO film is almost impossible. In other words, it is confirmed that in evaluation samples 4 to 6, it is possible to promote the etching of the first film as compared with the comparative evaluation sample.

Moreover, in the case of evaluation samples 1 to 3, it may be seen that even in a case where the supply time of the etching agent is lengthened, etching is not performed beyond a certain etching amount. Thus, it is confirmed that the etching reaction may be saturated when the first film includes an O-free film such as a SiN film or the like. On the other hand, in the case of evaluation samples 4 to 6, unlike the case of evaluation samples 1 to 3, it may be seen that the etching amount may be increased by lengthening the supply time of the etching agent. Thus, it is confirmed that the etching reaction may be made unsaturated when the first film includes an O-containing film such as a SiO film or the like.

Further, it may be noted that in any of evaluation samples 1 to 6, the etching of the first film may be promoted by setting the thickness of the first layer to 1 to 3 nm or more. Moreover, in any of evaluation samples 1 to 6, it may be seen that the etching amount of the first film increases as the thickness of the first layer increases. Accordingly, it is also confirmed that the etching amount of the first film in step B is controlled by the thickness of the first layer formed in step A.

According to the present disclosure in some embodiments, it is possible to perform stable etching with good controllability.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

performing a cycle a predetermined number of times, the cycle including:

(a) forming a first layer on a surface of a first film by supplying a processing agent to a substrate including the first film on a surface of the substrate; and (b) etching the first layer and at least a portion of the first film by supplying an etching agent to the substrate, wherein the first layer contains $H_2O$ as a substance X, and wherein in (b), when etching the first layer, the substance X that reacts with the etching agent but does not contribute alone to the etching is generated, and the first layer and the at least a portion of the first film are etched by using a mixture of the substance X and the etching agent.

2. The method of claim 1, wherein the first layer contains hydrogen and oxygen.

3. The method of claim 1, wherein an amount of $H_2O$ contained in the first layer is larger than an amount of $H_2O$ contained in the first film.

4. The method of claim 1, wherein a processing temperature when forming the first layer is lower than a processing temperature when forming the first film.

5. The method of claim 1, wherein the first layer is an oxide layer.

6. The method of claim 1, wherein the etching agent is a fluorine-containing gas.

7. The method of claim 1, wherein the etching agent is a hydrogen- and fluorine-containing gas.

8. The method of claim 1, wherein the substance X is a substance that reacts with the etching agent to promote the etching.

9. The method of claim 1, wherein an etching amount of the first film in (b) is controlled by a thickness of the first layer formed in (a).

10. The method of claim 1, wherein the first film includes an oxygen-containing film.

11. The method of claim 1, wherein in (b), the substance X is further generated when the at least a portion of the first film is etched.

12. The method of claim 1, wherein the first film includes an oxygen-free film.

13. A method of manufacturing a semiconductor device, comprising the method of claim 1.

14. The method of claim 1, wherein a $H_2O$ molecule is held in the first layer by being bonded with another component in the first layer.

15. The method of claim 1, wherein the first layer is a silicon oxide layer containing $H_2O$, or a silicon oxycarbide layer containing $H_2O$.

16. The method of claim 1, wherein in (a), a precursor and a reactant containing hydrogen and oxygen are supplied as the processing agent to the substrate.

17. The method of claim 16, wherein in (a), (a1) supplying the precursor to the substrate and (a2) supplying the reactant to the substrate are performed alternately, and wherein in at least one selected from the group of (a1) and (a2), a catalyst is further supplied to the substrate.

18. The method of claim 1, wherein the substrate includes the first film and a second film on the surface of the substrate, and wherein the method further comprises (c) forming an inhibitor layer as a second layer on a surface of the second film by supplying a modifying agent to the substrate before performing (a).

19. The method of claim 18, wherein the cycle further includes (c).

20. The method of claim 1, wherein in (a), the first layer is formed by performing a sub-cycle one or more times, the sub-cycle including:

(a3) forming a first precursor layer by supplying a precursor to the substrate; and (a4) converting the first precursor layer into a second precursor layer by supplying a reactant containing $H_2O$ to the substrate.

21. The method of claim 20, wherein the sub-cycle is performed at least two times.

22. A substrate processing apparatus, comprising:

a process chamber in which a substrate is processed;

a processing agent supply system configured to supply a processing agent to the substrate in the process chamber;

an etching agent supply system configured to supply an etching agent to the substrate in the process chamber; and a controller configured to be capable of controlling the processing agent supply system and the etching agent supply system to perform, in the process chamber, a cycle a predetermined number of times, the cycle including: (a) forming a first layer on a surface of a first film by supplying the processing agent to the substrate including the first film on a surface of the substrate; and (b) etching the first layer and at least a portion of the first film by supplying the etching agent to the substrate, wherein the first layer contains $H_2O$ as a substance X, and wherein in (b), when etching the first layer, the substance X that reacts with the etching agent but does not contribute alone to the etching is generated, and the first layer and the at least a portion of the first film are etched by using a mixture of the substance X and the etching agent.

23. A non-transitory computer-readable recording medium storing a program that causes, by a computer, a substrate processing apparatus to perform a cycle a predetermined number of times, the cycle including:

(a) forming a first layer on a surface of a first film by supplying a processing agent to a substrate including the first film on a surface of the substrate; and (b) etching the first layer and at least a portion of the first film by supplying an etching agent to the substrate, wherein the first layer contains $H_2O$ as a substance X, and wherein in (b), when etching the first layer, the substance X that reacts with the etching agent but does not contribute alone to the etching is generated, and the first layer and the at least a portion of the first film are etched by using a mixture of the substance X and the etching agent.

* * * * *